(12) United States Patent
Shim et al.

(10) Patent No.: US 11,157,105 B2
(45) Date of Patent: Oct. 26, 2021

(54) DISPLAY APPARATUS

(71) Applicant: Samsung Display Co., Ltd., Yongin-Si (KR)

(72) Inventors: Bo-youl Shim, Asan-si (KR); Joonsam Kim, Hwaseong-si (KR); Hun-tae Kim, Seoul (KR); Wuhyeon Jung, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/985,587

(22) Filed: Aug. 5, 2020

(65) Prior Publication Data

US 2020/0363895 A1 Nov. 19, 2020

Related U.S. Application Data

(63) Continuation of application No. 16/204,386, filed on Nov. 29, 2018, now Pat. No. 10,739,892.

(30) Foreign Application Priority Data

Nov. 30, 2017 (KR) .................. 10-2017-0163539

(51) Int. Cl.
*G02F 1/1345* (2006.01)
*H01L 27/12* (2006.01)
(Continued)

(52) U.S. Cl.
CPC ........ *G06F 3/0412* (2013.01); *G02F 1/13458* (2013.01); *G06F 3/044* (2013.01);
(Continued)

(58) Field of Classification Search
CPC ... G06F 3/0412; G06F 3/044; H01L 27/3276; H01L 27/124; H01L 27/323;
(Continued)

(56) References Cited

U.S. PATENT DOCUMENTS 7,580,107 B2  8/2009  Moon
9,202,408 B2  12/2015  Choi et al.
(Continued)

FOREIGN PATENT DOCUMENTS

EP  3376350 A1  9/2018
KR  100895311 B1  5/2009
(Continued)

OTHER PUBLICATIONS

Extended European Search Report for Application No. 18209090.2-1212 dated May 9, 2019.

*Primary Examiner* — Brent D Castiaux
(74) *Attorney, Agent, or Firm* — Cantor Colburn LLP

(57) ABSTRACT

A display apparatus includes a substrate including a display area and a non-display area, a display element layer, a pad group, a touch electrode layer, and a touch insulation layer. The display element layer includes display elements disposed in the display area. The pad group is disposed on the substrate and includes output pads disposed in the non-display area. The output pads include central output pads and outer output pads disposed outside the central output pads in a first direction. The touch electrode layer is disposed on the display element layer. The touch insulation layer is disposed on the display element layer and contacts the touch electrode layer. A groove pattern is defined in the touch insulation layer overlapping the non-display area, and does not overlap at least a predetermined number of the outer output pads in a second direction.

20 Claims, 18 Drawing Sheets

(51) Int. Cl.
*G09G 3/32* (2016.01)
*G06F 3/041* (2006.01)
*H01L 51/00* (2006.01)
*G06F 3/044* (2006.01)
*H01L 27/32* (2006.01)
*G02F 1/1362* (2006.01)

(52) U.S. Cl.
CPC ............. *G09G 3/32* (2013.01); *H01L 27/124* (2013.01); *H01L 27/323* (2013.01); *H01L 27/3276* (2013.01); *H01L 51/0097* (2013.01); *G02F 1/136254* (2021.01)

(58) Field of Classification Search
CPC ............. H01L 51/0097; G02F 1/13458; G02F 1/136254; G09G 3/32; Y02E 10/549

See application file for complete search history.

(56) References Cited

U.S. PATENT DOCUMENTS

| | | | |
|---|---|---|---|
| 9,591,754 | B2 | 3/2017 | Lee |
| 2013/0026476 | A1 | 1/2013 | Park et al. |
| 2013/0222297 | A1 | 8/2013 | Adachi et al. |
| 2014/0367658 | A1* | 12/2014 | Kwak ................. H01L 27/1218 257/40 |
| 2015/0177878 | A1 | 6/2015 | Cheng et al. |
| 2015/0187803 | A1 | 7/2015 | Moh et al. |
| 2015/0255739 | A1* | 9/2015 | Kim ................... H01L 27/3258 257/40 |
| 2016/0323993 | A1 | 11/2016 | Kwon et al. |
| 2018/0269269 | A1 | 9/2018 | Kim et al. |

FOREIGN PATENT DOCUMENTS

| | | |
|---|---|---|
| KR | 100943730 B1 | 2/2010 |
| KR | 101341030 B1 | 12/2013 |
| KR | 101427135 B1 | 8/2014 |
| KR | 1020140098937 A | 8/2014 |
| KR | 1020180105551 A | 9/2018 |

* cited by examiner

DISPLAY APPARATUS

This application is a continuation of U.S. patent application Ser. No. 16/204,386, filed on Nov. 29, 2018, which claims priority to Korean Patent Application No. 10-2017-0163539, filed on Nov. 30, 2017, and all the benefits accruing therefrom under 35 U.S.C. § 119, the content of which in its entirety is herein incorporated by reference.

BACKGROUND

1. Field

Exemplary embodiments of the invention herein relate to a display apparatus, and more particularly, to a flexible display apparatus.

2. Description of the Related Art

Various display devices such as a television, a mobile phone, a tablet computer, a navigation, and a game console are being developed. In recent years, as technologies are advanced, a flexible display device is being developed.

SUMMARY

A flexible display device has a limitation in that the flexible display device receives a stress caused by bending, and internal components are damaged due to stress. Furthermore, the flexible display device may be easily damaged even during a manufacturing process. In particular, a crack may be generated in a display panel in a process of mounting a driving integrated circuit to the display panel.

Exemplary embodiments of the invention provide a display apparatus capable of preventing short-circuit from occurring between output pads and input pads caused by a delamination phenomenon between a touch insulation layer and an interlayer insulation film by defining a groove pattern in the touch insulation layer.

Exemplary embodiments of the invention also provide a display apparatus capable of preventing a crack, which is generated due to a stress concentrated around pads disposed at an outer portion of the display panel when a driving circuit chip is disposed (e.g., mounted) on a display panel, from being generated in a display panel.

An exemplary embodiment of the invention provides a display apparatus including a substrate, signal lines, a display element layer, a pad group, an intermediate insulation layer, a touch electrode layer, and a touch insulation layer.

In an exemplary embodiment, the substrate may include a display area and a non-display area disposed outside the display area.

In an exemplary embodiment, the signal lines may be disposed on the substrate.

In an exemplary embodiment, the display element layer may be disposed on the signal lines and include display elements disposed in the display area.

In an exemplary embodiment, the pad group may be electrically connected to the signal lines and include output pads disposed in the non-display area.

In an exemplary embodiment, the intermediate insulation layer may be disposed between the signal lines and the display element layer to expose the output pads.

In an exemplary embodiment, the touch electrode layer may be disposed on the display element layer.

In an exemplary embodiment, the touch insulation layer may be disposed on the display element layer and contact the touch electrode layer, and a groove pattern may be defined in the touch insulation layer in the non-display area.

In an exemplary embodiment, the output pads may include central output pads and outer output pads disposed outside the central output pads in a first direction.

In an exemplary embodiment, the groove pattern may be disposed between the output pads and the intermediate insulation layer and may not overlap at least a predetermined number of the outer output pads in a second direction crossing the first direction in a plan view.

In an exemplary embodiment of the invention, a display apparatus includes a substrate, signal lines, a display element layer, a pad group, a driving circuit chip, a touch electrode layer, a touch insulation layer, and a compensation pattern.

In an exemplary embodiment, the substrate may include a display area and a non-display area disposed outside the display area.

In an exemplary embodiment, the signal lines may be disposed on the substrate.

In an exemplary embodiment, the display element layer may be disposed on the signal lines and include display elements disposed in the display area.

In an exemplary embodiment, the pad group may be electrically connected to the signal lines and include output pads disposed in the non-display area.

In an exemplary embodiment, the intermediate insulation layer may be disposed between the signal lines and the display element layer to expose the output pads.

In an exemplary embodiment, the touch electrode layer may be disposed on the display element layer.

In an exemplary embodiment, the touch insulation layer may be disposed on the display element layer and contact the touch electrode layer, and a groove pattern may be defined in the touch insulation layer in the non-display area.

In an exemplary embodiment, the compensation pattern may be disposed on the touch insulation layer and overlap the groove pattern.

In an exemplary embodiment, the output pads may include central output pads and outer output pads disposed outside the central output pads in a first direction that is an extension direction of a short side of each of the output pads.

In an exemplary embodiment, the groove pattern may be disposed between the output pads and the intermediate insulation layer.

In an exemplary embodiment, the compensation pattern may overlap at least a predetermined number of the outer output pads in a second direction crossing the first direction in a plan view.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
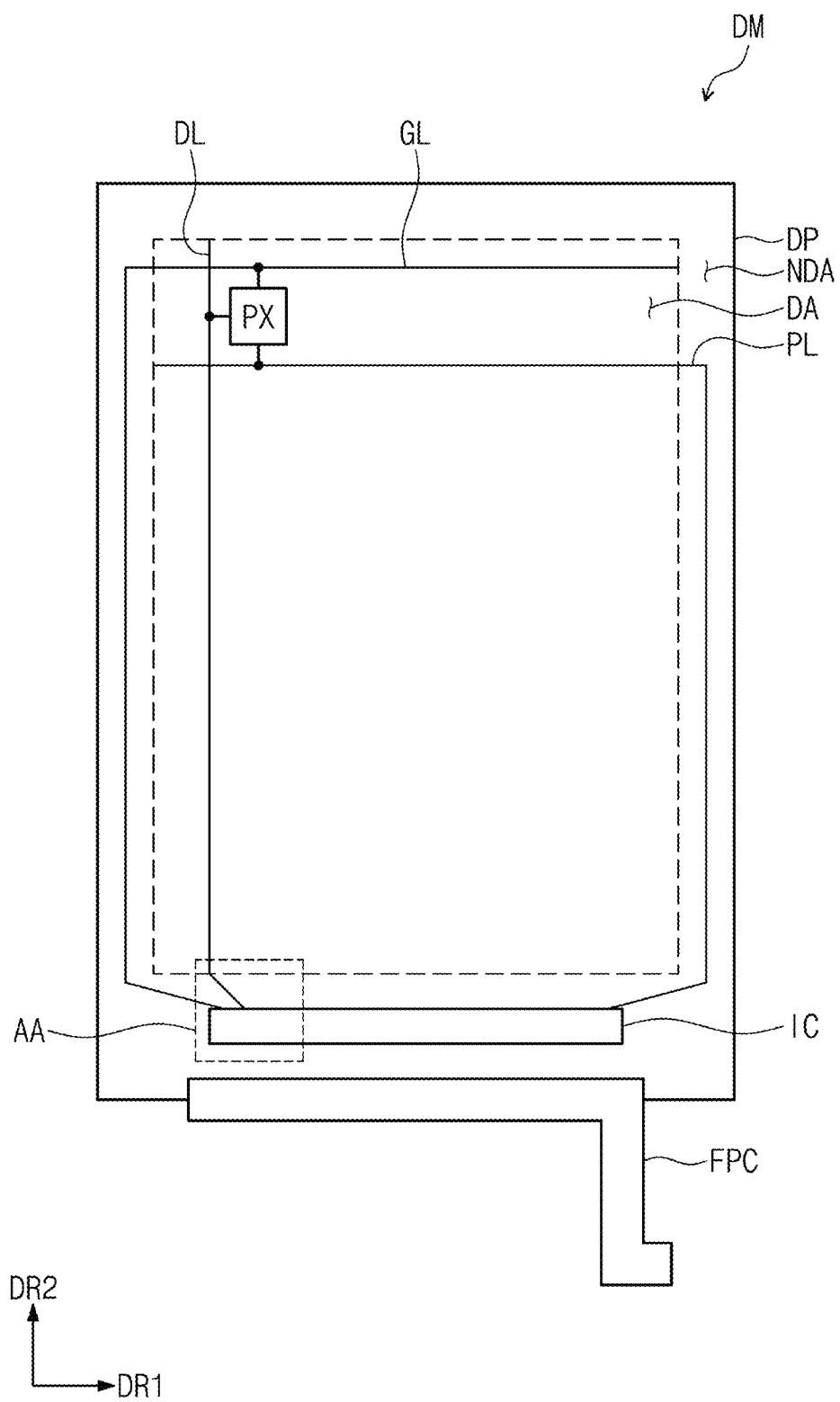
FIG. 1 is a plan view of an exemplary embodiment of a display apparatus according to the invention.

Hereinafter, embodiments of the invention will be described with reference to the accompanying drawings. In this specification, it will also be understood that when one component (or region, layer, portion) is referred to as being 'on', 'connected to', or 'coupled to' another component, it may be directly connected/coupled on/to the one component, or an intervening third component may also be present.

Like reference numerals refer to like elements throughout. Also, in the drawing figures, the thickness, ratio, and dimensions of components are exaggerated for clarity of illustration. The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another exemplary embodiment without departing from the scope of the appended claims. The terms of a singular form may include plural forms unless referred to the contrary.

Also, ""under", "below", "above", "upper", and the like are used for explaining relation association of components illustrated in the drawings. The terms may be a relative concept and described based on directions expressed in the drawings.

The meaning of 'include' or specifies a property, a fixed number, a step, an operation, an element, a component or a combination thereof, but does not exclude other properties, fixed numbers, steps, operations, elements, components or combinations thereof It will be understood that when an element is referred to as being "on" another element, it can be directly on the other element or intervening elements may be therebetween. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a plan view of a display apparatus DM according to an exemplary embodiment of the invention.

Referring to FIG. 1, the display apparatus DM includes a display panel DP, a driving circuit chip IC, and a flexible printed circuit board FPC.

The display panel DP may be a light emitting type display panel. However, the invention is not particularly limited thereto. In an exemplary embodiment, the display panel DP may be an organic light emitting display panel or a quantum dot light emitting display panel, for example. The organic light emitting display panel includes a light emitting layer including an organic light emitting material. The quantum dot light emitting display panel includes a light emitting layer including a quantum dot and a quantum dot rod. Hereinafter, the display panel DP will be described as the organic light emitting display panel.

The display panel DP includes a display area DA and a non-display area NDA disposed adjacent to the display area DA. The non-display area NDA may be an area on which an image is not displayed. In an exemplary embodiment, the display area DA may have a rectangular shape, for example. The non-display area NDA may surround the display area DA. However, the invention is not limited thereto. In an exemplary embodiment, the display area DA and the non-display area NDA may be changed in shape, for example.

Hereinafter, in an exemplary embodiment, a direction of a short side of the display panel DP is defined by a first direction DR1, a direction of a long side of the display panel DP is defined by a second direction DR2, and a direction of a normal line of the display panel DP is defined by a third direction.

The display panel DP may include a plurality of signal lines and a pixel PX.

The signal lines may include a scan line GL, a data line DL, and a power line PL. Although each of the scan line GL, the data line DL, and the power line PL is provided in plurality, one scan line GL, one data line DL, and one power line PL are exemplarily illustrated in FIG. 1. The scan line GL, the data line DL, and the power line PL are connected to the pixel PX. In FIG. 1, the scan line GL, the data line DL, and the power line PL are exemplarily connected to the driving circuit chip IC. However, the invention is not limited thereto. In an exemplary embodiment, a portion of each of the scan line GL, the data line DL and the power line PL may be connected to the flexible printed circuit board FPC to receive a driving signal, for example.

The signal lines may be provided by patterning a first conductive layer and a second conductive layer, which are disposed on different layers. A position relationship between the first conductive layer and the second conductive layer will be described later.

The display panel DP may include a scan driving circuit (not shown) disposed on the non-display area NDA. The scan driving circuit (not shown) may receive a driving signal from the driving circuit chip IC or the flexible printed circuit board FPC and supply a scan signal to the scan line GL.

The pixel PX may be connected to the scan line GL and the data line DL to display an image. The pixel PX may display one of red, green, and blue colors. However, the invention is not limited thereto. In an exemplary embodiment, the pixel PX may display other colors (e.g., white color) in addition to the red, green, and blue colors, for example. Although the pixel PX has a rectangular shape in FIG. 1 as an example, the invention is not limited thereto. In an exemplary embodiment, the shape of the pixel PX may be changed into various shapes such as polygonal, circular, and elliptical shapes, for example.

The driving circuit chip IC may be attached to the non-display area NDA of the display panel DP. The driving circuit chip IC provides a signal necessary for driving the display panel DP. The driving circuit chip IC may be a source driver integrated circuit for providing a data signal to the data line DL. However, the invention is not limited thereto. In an exemplary embodiment, the driving circuit chip IC may be a universal driver integrated circuit in which all circuits including the scan driving circuit providing a scan signal to the scan line GL are integrated. Here, the scan driving circuit may not be disposed on the display panel DP, for example.

In an exemplary embodiment of the invention, the driving circuit chip IC may be disposed (e.g., mounted) on the display panel DP in a chip-on-panel ("COP") method, for example.

The flexible printed circuit board FPC may be connected to one end of the display panel DP in a second direction DR2. The flexible printed circuit board FPC may be directly connected to the signal lines disposed on the display panel DP or connected to the driving circuit chip IC to transmit a signal received from the outside.

Figure 2:
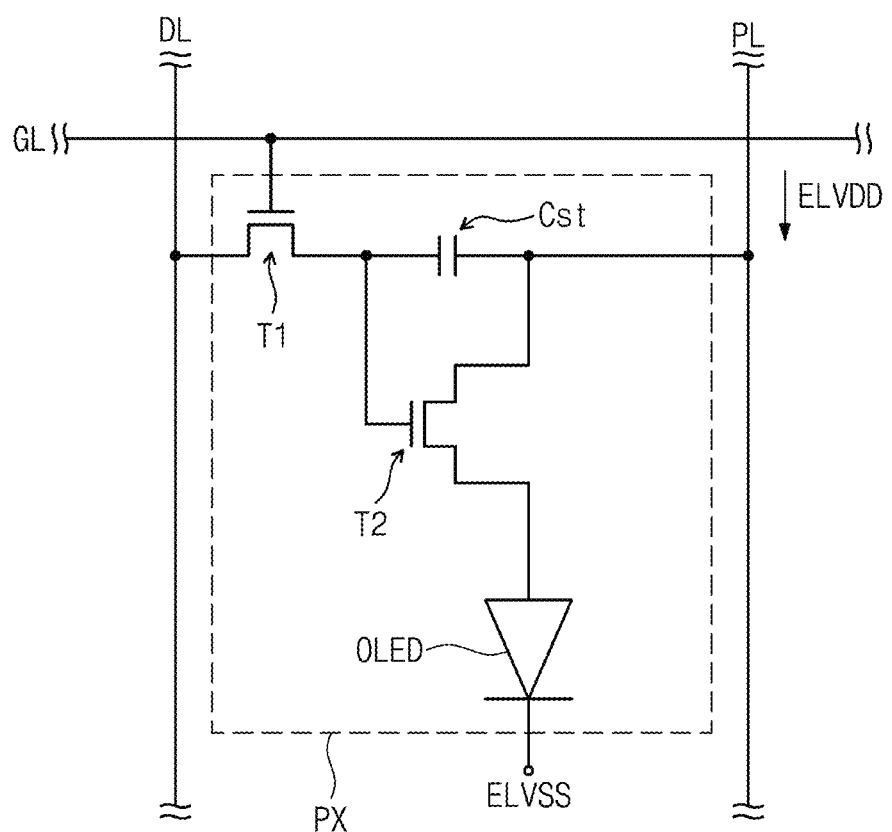
FIG. 2 is an equivalent circuit diagram of one pixel.

FIG. 2 is an equivalent circuit diagram of one pixel PX. FIG. 2 exemplarily illustrates the pixel PX connected to the scan line GL, one of the data lines DL, and the power line PL. However, the invention is not limited to the configuration of the pixel PX.

The organic light emitting diode OLED may be a front light emitting diode or a rear light emitting diode. The pixel PX that is a pixel driving circuit for driving an organic light emitting diode OLED includes a first transistor T1 (or a switching transistor), a second transistor T2 (or a driving transistor), and a capacitor Cst. A first power voltage ELVDD is provided to the second transistor T2, and a second power voltage ELVSS is provided to the organic light emitting diode OLED. The second power voltage ELVSS may be less than the first power voltage ELVDD.

The first transistor T1 outputs a data signal applied to the data line DL in response to a scan signal applied to the scan line GL. The capacitor Cst charges a voltage corresponding to a data signal received from the first transistor T1.

The second transistor T2 is connected to the organic light emitting diode OLED. The second transistor T2 controls a driving current flowing through the organic light emitting diode OLED in correspondence to a quantity of an electric charge stored in the capacitor Cst. The organic light emitting diode OLED emits light during a turn-on interval of the second transistor T2.

Figure 3:
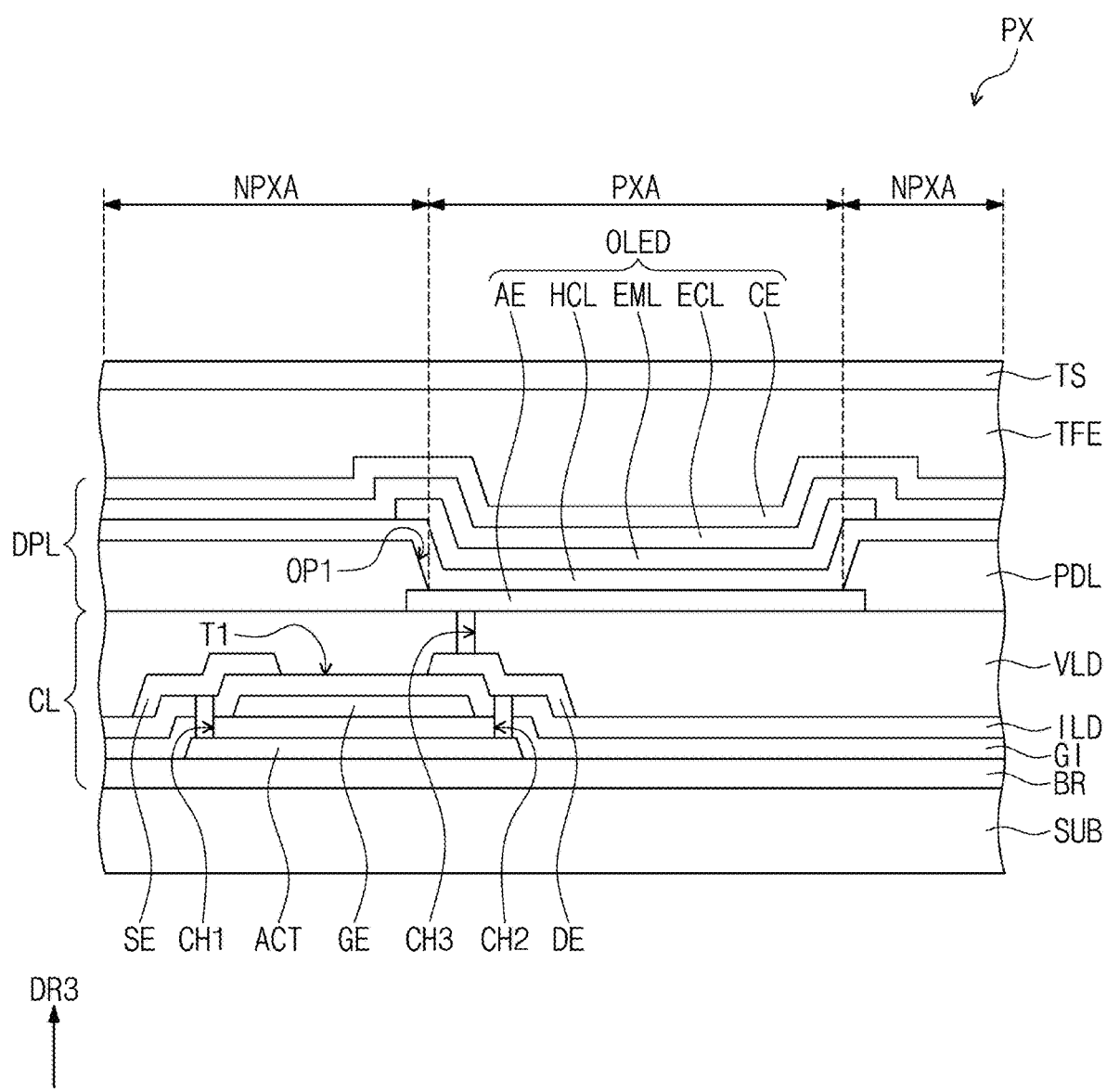
FIG. 3 is a partial cross-sectional view of the display panel in correspondence to one pixel.

FIG. 3 is a partial cross-sectional view of the display panel in correspondence to one pixel PX.

The display panel DP includes a substrate SUB, a circuit element layer CL, a display element layer DPL, a thin-film encapsulation layer TFE, and a touch sensor TS. Although not shown, the display panel DP may further include a reflection protective layer and/or a window member, which are disposed on the touch sensor TS.

The substrate SUB may include at least one plastic film. The substrate SUB may be flexible. In an exemplary embodiment, the substrate SUB may include a plastic substrate, a glass substrate, a metal substrate, or an organic/inorganic composite substrate, for example. The display area DA and the non-display area NDA described with reference to FIG. 1 may be defined on the substrate SUB in the same manner.

The circuit element layer CL may include the signal lines, the scan line GL, the data line DL, and the power line PL, which are described with reference to FIG. 2. Also, the circuit element layer CL may include the first transistor T1, the second transistor T2, and the capacitor Cst. In FIG. 3, the first transistor T1 is exemplarily described.

The circuit element layer CL may include a barrier layer BR, an active layer ACT, a gate insulation film GI, a gate electrode GE, an interlayer insulation film ILD, input and output electrodes SE and DE, and an intermediate insulation layer VLD.

The barrier layer BR is disposed on the substrate SUB and prevent foreign substances from being introduced through an upper portion of the barrier layer BR.

Although not shown, the display panel DP may further include a buffer film (not shown) disposed on the barrier layer BR. The buffer film (not shown) increases a coupling force between the substrate SUB and layers disposed above the substrate SUB. The barrier layer BR and the buffer film (not shown) may be selectively provided or omitted.

The active layer ACT is disposed on the barrier layer BR. The active layer ACT may serve as a channel area of the first transistor T1. In an exemplary embodiment, the active layer ACT may include amorphous silicon, polysilicon, and a metal oxide semiconductor, for example.

The gate insulation film GI may be disposed on the active layer ACT. The gate insulation film GI may insulate the gate electrode GE from the active layer ACT.

The gate electrode GE may be disposed on the gate insulation film GI. The gate electrode GE may be disposed on the active layer ACT while overlapping the same.

A first conductive layer (not shown) constituting signal lines may be disposed in the same layer as the gate electrode GE.

The interlayer insulation film ILD is disposed on the gate electrode GE. The interlayer insulation film ILD electrically insulates the gate electrode GE and the input and output electrodes SE and DE from each other. The interlayer insulation film ILD may include an inorganic material. In an exemplary embodiment, the inorganic material may include a silicon nitride, a silicon oxynitride, and a silicon oxide, for example.

The input and output electrodes SE and DE is disposed on the interlayer insulation film ILD. The input and output electrodes SE and DE may be electrically connected to the active layer ACT through first and second contact holes CH1 and CH2 defined in the gate insulation film GI, respectively.

A second conductive layer (not shown) constituting signal lines may be disposed in the same layer as the input and output electrodes SE and DE.

Although the display panel DP exemplarily has a top-gate structure in which the gate electrode GE is disposed on the active layer ACT in an exemplary embodiment of the invention, the display panel DP may have a bottom-gate structure in which the gate electrode GE is disposed below the active layer ACT in another exemplary embodiment.

The interlayer insulation film ILD is disposed on the input and output electrodes SE and DE. The interlayer insulation film ILD may provide a planar surface. The interlayer insulation film ILD may include an organic material. In an exemplary embodiment, the organic material may include at least one of an acryl-based resin, a methacryl-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin, for example.

The display element layer DPL is disposed on the intermediate insulation layer VLD. The display element layer DPL may include a pixel defining film PDL and a display element. In an exemplary embodiment of the invention, the display element may be the organic light emitting diode OLED. The organic light emitting diode OLED includes a first electrode AE, a hole control layer HCL, a light emitting layer EML, an electron control layer ECL, and a second electrode CE.

The pixel defining layer PDL may include an organic material. The first electrode AE is disposed on the intermediate insulation layer VLD. The first electrode AE is connected to the output electrode DE through a third contact hole CH3 passing through the intermediate insulation layer VLD. A first opening OP1 is defined in the pixel defining film PDL. The first opening OP1 of the pixel defining film PDL exposes at least a portion of the first electrode AE.

The pixel may be disposed on a pixel area in a plan view. The pixel area may include a light emitting area PXA and a non-light emitting area NPXA disposed adjacent to the light emitting area PXA. The non-light emitting area NPXA may surround the light emitting area PXA. In this exemplary embodiment, the light emitting area PXA is defined in correspondence to a partial area of the first electrode AE, which is exposed by the first opening OP1.

The hole control layer HCL may be disposed in the light emitting area PXA and the non-light emitting area NPXA in common. Although not separately shown, a common layer such as the hole control layer HCL may be provided in the plurality of pixels PX in common.

The light emitting layer EML is disposed on the hole control layer HCL. The light emitting layer EML may be disposed in an area corresponding to the opening OP1. That is, the light emitting layer EML may be separately provided in each of the plurality of pixels PX. The light emitting layer EML may include an organic material and/or an inorganic material. Although the patterned light emitting layer EML is exemplarily illustrated in this exemplary embodiment, the light emitting layer EML may be disposed in the plurality of pixels PX in common. In an exemplary embodiment, the light emitting layer EML may generate white-color light, for example. Also, the light emitting layer EML may have a multi-layer structure.

The electron control layer ECL is disposed on the light emitting layer EML. Although not separately shown, a common layer such as the hole control layer HCL may be provided in the plurality of pixels PX in common.

The second electrode CE is disposed on the electron control layer ECL. The second electrode CE is disposed in the plurality of pixels PX in common.

The thin-film encapsulation layer TFE is disposed on the second electrode CE. The thin-film encapsulation layer TFE is disposed in the plurality of pixels PX in common. In this exemplary embodiment, the thin-film encapsulation layer TFE directly covers the second electrode CE. In another exemplary embodiment of the invention, a capping layer for covering the second electrode CE may be further disposed between the thin-film encapsulation layer TFE and the second electrode CE. Here, the thin-film encapsulation layer TFE may directly cover the capping layer.

The thin-film encapsulation layer TFE includes at least one inorganic film (hereinafter, referred to as an encapsulation inorganic film). The thin-film encapsulation layer TFE may further include at least one organic film (hereinafter, referred to as an encapsulation organic film). The encapsulation inorganic film protects the display element layer DPL from moisture/oxygen, and the encapsulation organic layer protects the display element layer DPL from foreign substances such as dust particles. In an exemplary embodiment, the encapsulation inorganic film may include a silicon nitride layer, a silicon oxynitride layer, a silicon oxide layer, a titanium oxide layer, or an aluminum oxide layer, for example. Although the encapsulation organic film may include an acryl-based organic layer, the invention is not limited thereto.

The touch sensor TS is disposed on the thin-film encapsulation layer TFE. The touch sensor TS acquires coordinate information of external input.

In an exemplary embodiment of the invention, the touch sensor TS is directly disposed on the thin-film encapsulation layer TFE. In this specification, a wording of "directly disposed" represents formation through a continuous process instead of attachment by a separated adhesive layer.

In an exemplary embodiment, the touch sensor TS may detect an external input in a capacitance method, for example. The invention is not limited to the operation method of the touch sensor TS. In an exemplary embodiment, the touch sensor TS according to an exemplary embodiment of the invention may detect an external input in an electromagnetic induction method or a pressure sensing method, for example.

The touch sensor TS may have a multi-layer structure. The touch sensor TS may include a single-layer or multi-layer conductive layer. The touch sensor TS may include a single-layer or multi-layer insulation layer.

Figure 4:
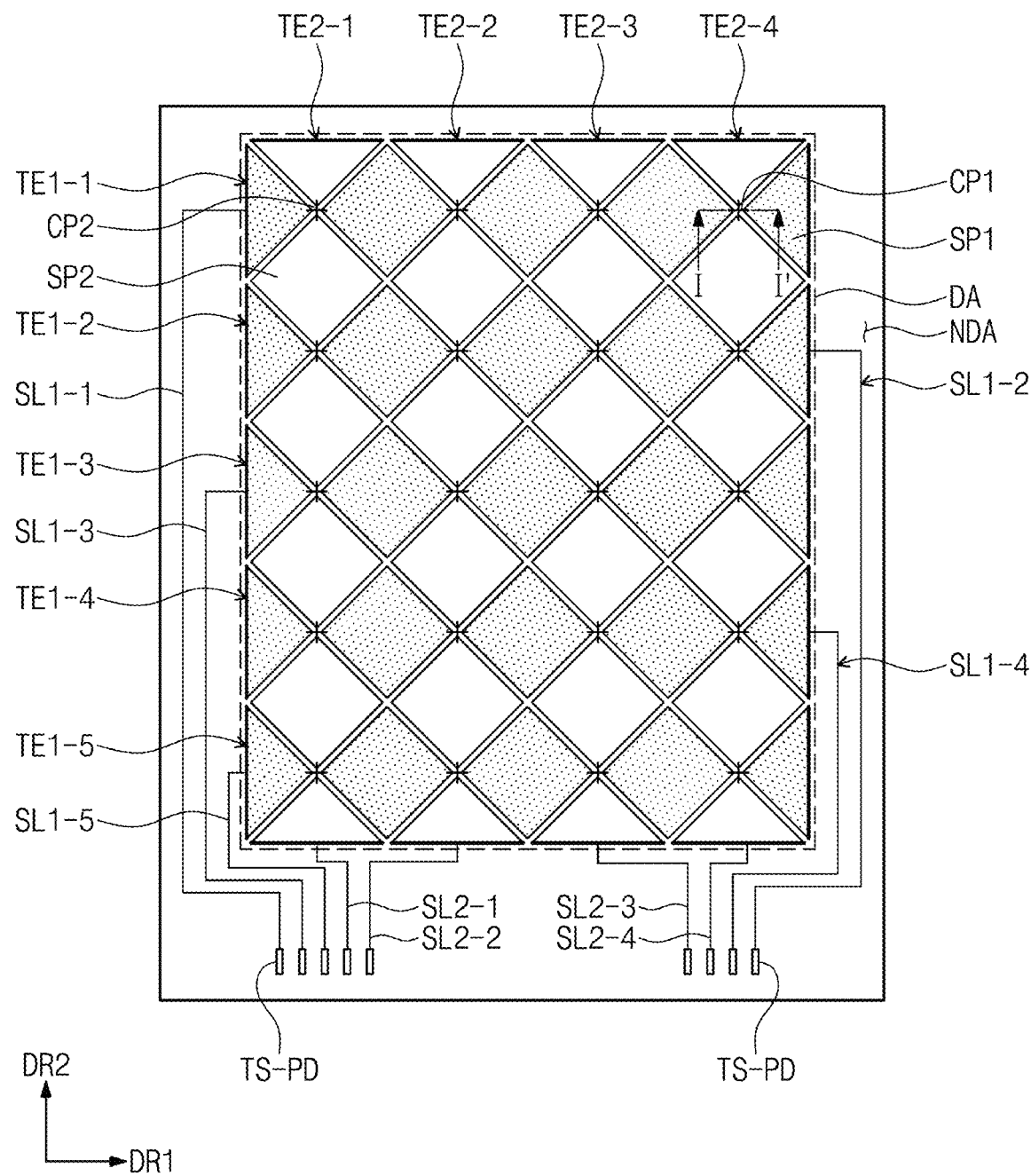
FIG. 4 is a plan view of a touch sensor in FIG. 3.
Figure 5:
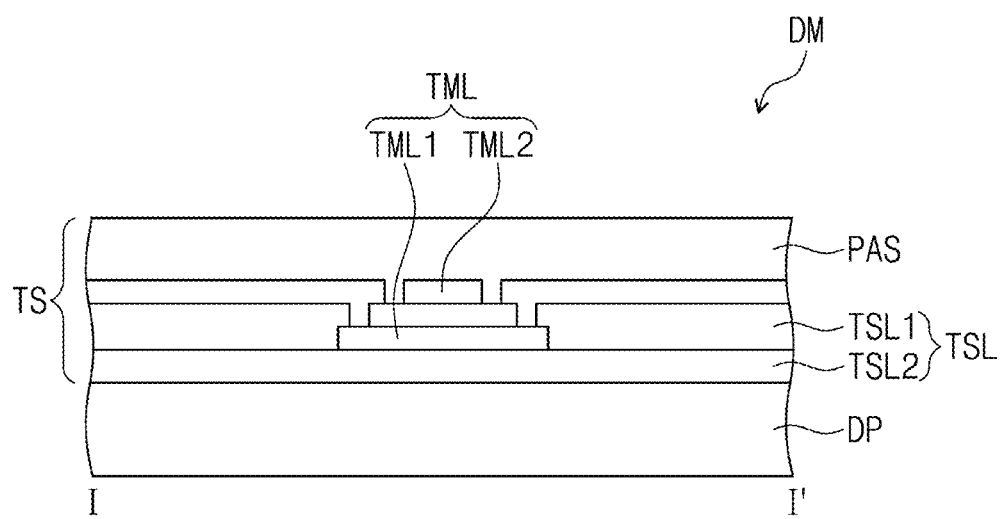
FIG. 5 is a cross-sectional view taken along line I-I' of FIG. 4.

FIG. 4 is a plan view of the touch sensor in FIG. 3, and FIG. 5 is a cross-sectional view taken along line I-I' in FIG. 4.

The touch sensor TS may include a touch electrode layer TML and a touch insulation layer TSL. The touch insulation layer TSL may contact the touch electrode layer TML.

The touch electrode layer TML may include a first touch electrode layer TML1 and a second touch electrode layer TML2. The touch insulation layer TSL may include a first touch insulation layer TSL1 and a second touch insulation layer TSL2.

The second touch electrode layer TML2 may be disposed on the first touch electrode layer TML1.

Each of the first touch electrode layer TML1 and the second touch electrode layer TML2 may have a single-layer structure or a laminated multi-layer structure. The conductive layer having a multi-layer structure may include at least two or more layers of transparent layers and metal layers. The conductive layer having the multi-layer structure may include metal layers each of which includes different metal from each other. In an exemplary embodiment, the transparent conductive layer may include an indium tin oxide ("ITO"), an indium zinc oxide ("IZO"), a zinc oxide ("ZnO"), an indium tin zinc oxide ("ITZO"), PEDOT, a metal nano-wire, and graphene, for example. In an exemplary embodiment, the metal layer may include molybdenum, silver, titanium, copper, aluminum, and an alloy thereof, for example. In an exemplary embodiment, each of the first touch electrode layer TML1 and the second touch electrode layer TML2 may have a three-layer structure of titanium/aluminum/titanium, for example.

The first touch insulation layer TSL1 may be disposed between the first touch electrode layer TML1 and the second touch electrode layer TML2. The second touch insulation layer TSL2 may be disposed between the uppermost layer (thin-film encapsulation layer TFE (refer to FIG. 3)) of the display panel DP and the first touch electrode layer TML1. However, the invention is not limited thereto. In an exemplary embodiment, the second touch insulation layer TSL2 may be selectively omitted, for example.

Each of the first touch insulation layer TSL1 and the second touch insulation layer TSL2 may include an inorganic material. In an exemplary embodiment, the inorganic material may include a silicon nitride, a silicon oxynitride, and a silicon oxide, for example.

The touch sensor TS may further include a planarization film PAS disposed on the second touch electrode layer TML2. The planarization film PAS may provide a planar surface and include an organic material.

As illustrated in FIG. 4, the touch sensor TS may include: first touch electrodes TE1-1 to TE1-5, first touch signal lines SL1-1 to SL1-5 connected to the first touch electrodes TE1-1 to TE1-5, second touch electrodes TE2-1 to TE2-4, second touch signal lines SL2-1 to SL2-4 connected to the second touch electrodes TE2-1 to TE2-4, and touch pads TS-PD connected to the first touch signal lines SL1-1 to SL1-5 and the second touch signal lines SL2-1 to SL2-4.

Each of the first touch electrodes TE1-1 to TE1-4 may have a mesh shape in which a plurality of touch openings is defined. Each of the first touch electrodes TE1-1 to TE1-4 includes a plurality of first touch sensor parts SP1 and a plurality of first connecting parts CP1. The first touch sensor parts SP1 are disposed in the first direction DR1. Each of the first connecting parts CP1 connects two first touch sensor parts SP1 adjacent to each other among the first touch sensor parts SP1. Although not specifically shown, the first touch signal lines SL1-1 to SL1-5 may also have the mesh shape.

The second touch electrodes TE2-1 to TE2-4 cross the first touch electrodes TE1-1 to TE1-4 in an insulation manner. Each of the second touch electrodes TE2-1 to TE2-4 may have a mesh shape in which a plurality of touch openings is defined. Each of the second touch electrodes TE2-1 to TE2-4 includes a plurality of second touch sensor parts SP2 and a plurality of second connecting parts CP2. The second touch sensor parts SP2 are disposed in the second direction DR2. Each of the second connecting parts CP2 connects two second touch sensor parts SP2 adjacent to each other among the second touch sensor parts SP2. The second touch signal lines SL2-1 to SL2-4 may also have the mesh shape.

The first touch electrodes TE1-1 to TE1-5 and the second touch electrodes TE2-1 to TE2-4 are capacitively coupled to each other. As touch sensing signals are applied to the first touch electrodes TE1-1 to TE1-5, capacitors are provided between the first touch sensor parts SP1 and the second touch sensor parts SP2.

In this exemplary embodiment, the plurality of first connecting parts CP1 is provided from the first touch electrode layer TML1, and the plurality of first touch sensor parts SP1 and the plurality of second connecting parts CP2 are provided from the second touch electrode layer TML2.

However, the invention is not limited thereto. In an exemplary embodiment, a portion of the first touch sensor parts SP1, the plurality of first connecting parts CP1, the first touch signal lines SL1-1 to SL1-5, the second touch sensor parts SP2, the plurality of second connecting parts CP2, and the second touch signal lines SL2-1 to SL2-4 may be provided from the first touch electrode layer TML1 in FIG. 5, and another portion thereof may be provided from the second touch electrode layer TML2 in FIG. 5, for example.

Figure 6:
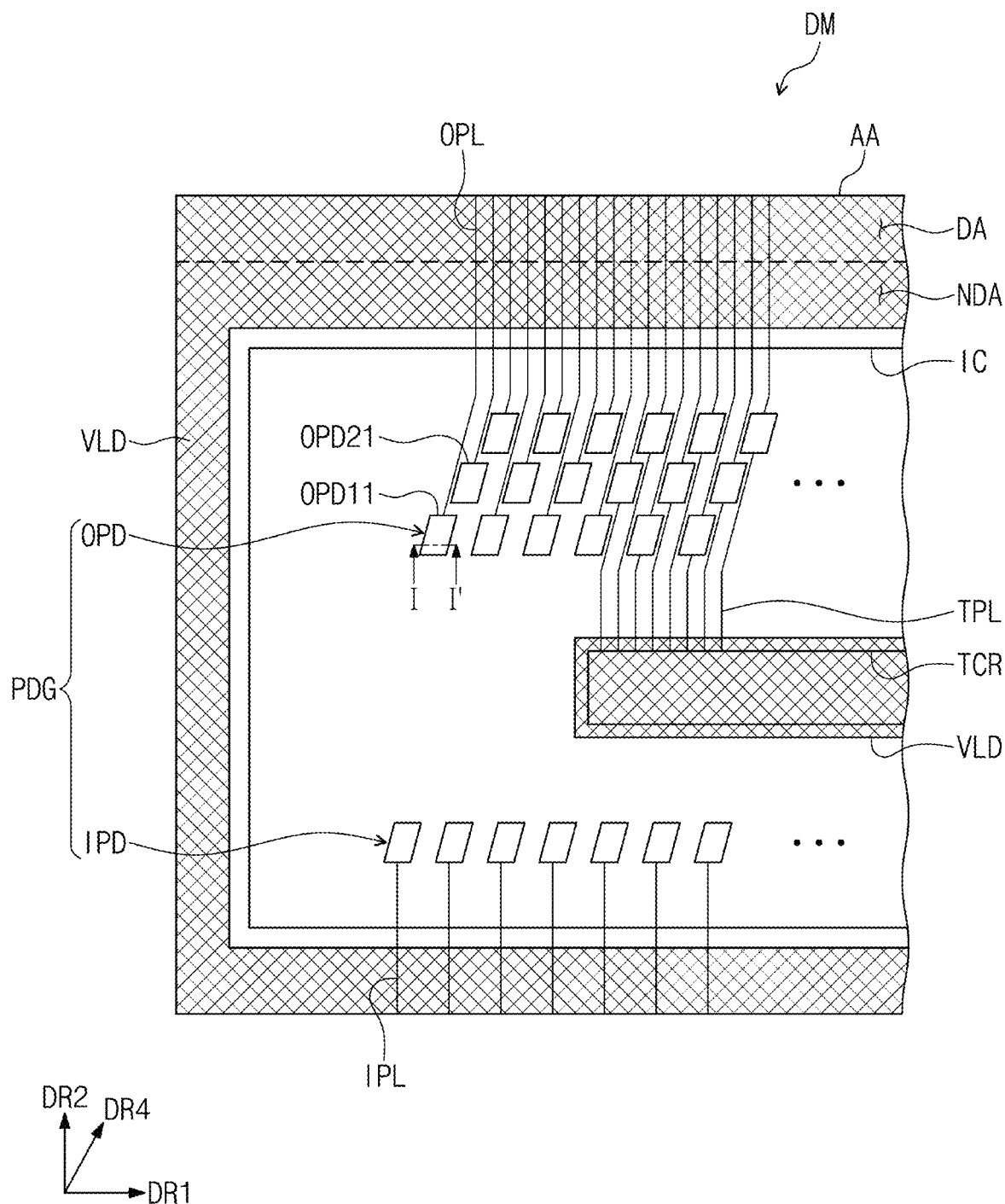
FIG. 6 is an enlarged plan view illustrating an area AA of the display apparatus in FIG. 1.

FIG. 6 is an enlarged partial plan view illustrating area AA of the display apparatus in FIG. 1.

Referring to FIGS. 1 and 6, the display panel DP may further include a pad group PDG disposed in the non-display area NDA and a test circuit TCR.

The pad group PDG may include input pads IPD and output pads OPD. The output pads OPD are disposed relatively closer to the display area DA than the input pads IPD is to the display area DA. The driving circuit chip IC is electrically connected to the display panel DP through the input pads IPD and the output pads OPD.

The display panel DP may further include output pad lines OPL and input pad lines IPL. The output pad lines OPL connect the output pads OPD to a portion (e.g., data lines DL) of the signal lines. The input pad lines IPL connect the input pads IPD to the flexible printed circuit board FPC.

The driving circuit chip IC receives a signal provided from the flexible printed circuit board FPC through the input pad lines IPL and the input pads IPD. The driving circuit chip IC may provide a signal to at least a portion of the scan line GL, the data line DL, and the power line PL through the output pads OPD and the output pad lines OPL.

The output pads OPD may be provided in a plurality of rows. The output pads OPD disposed in one row may be spaced apart from each other in the first direction DR1. Although the output pads OPD are exemplarily disposed in three rows in FIG. 6, the invention is not limited thereto. In an exemplary embodiment, the output pads OPD may be disposed in two or less rows or four or more rows, for example.

Although the input pads IPD are exemplarily provided in one row in FIG. 6, the invention is not limited thereto. In an exemplary embodiment, the input pads IPD may be provided in a plurality of rows, for example.

Each of the input pads IPD and the output pads OPD may have a short side and a long side. Each of the short sides of the input pads IPD and the output pads OPD may extend in the first direction DR1. Each of the long sides of the input pads IPD and the output pads OPD may extend in a fourth direction DR4 crossing the first and second directions DR1 and DR2.

Pads, which are disposed in rows corresponding to each other, of the plurality of output pads OPD disposed in rows different from each other may be spaced apart from each other in the fourth direction DR4. In an exemplary embodiment, an output pad OPD11 disposed in a first row and a first column and an output pad OPD21 disposed in a second row and a first row may be spaced apart from each other in the fourth direction DR4, for example.

The test circuit TCR may overlap the driving circuit chip IC in the non-display area NDA. The display panel DP may further include test pad lines TPL connecting the test circuit TCR to the output pads OPD. The test pad lines TPL may be connected to a predetermined number of the output pads OPD, e.g., the output pads OPD connected to the data line.

The test circuit TCR provides a signal for testing an operation state of the display panel DP before released as a final product to the display panel DP through the test pad lines TPL and the output pads OPD. The test circuit TCR after product release may be deactivated.

According to an exemplary embodiment of the invention, the test circuit TCR is provided to overlap the driving circuit chip IC instead of being provided in a partial area of the non-display area NDA that does not overlap the driving circuit chip IC. Accordingly, the non-display area NDA may be reduced in size, and thus, a space utilization rate may increase.

The intermediate insulation layer VLD exposes the pad group PDG so that the pad group PDG and the driving circuit chip IC contact each other. The intermediate insulation layer VLD serves to protect the test circuit TCR by covering the test circuit TCR.

In an exemplary embodiment of the invention, a groove pattern is defined around the pad group PDG in the touch insulation layer TSL (refer to FIG. 5) in a plan view. Detailed description will be described later.

Figure 7:
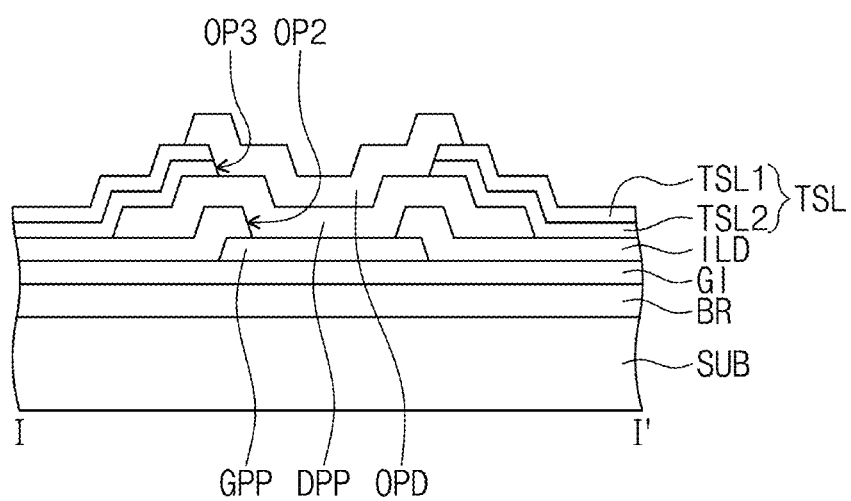
FIG. 7 is a cross-sectional view taken along line I-I' of FIG. 6.

FIG. 7 is a cross-sectional view taken along line I-I' of FIG. 6. The cross-sectional structure of one output pad of the output pads will be described with reference to FIG. 7. The output pads OPD and the input pads IPD are substantially the same in structure as each other.

Referring to FIGS. 1, 6, and 7, the display panel DP includes a data pad pattern DPP contacting the output pad OPD and a gate pad pattern GPP.

The gate pad pattern GPP is disposed in the same layer as the gate electrode GE in FIG. 3, the data pad pattern DPP is disposed in the same layer as the input and output electrodes SE and DE in FIG. 3, and the output pad OPD is disposed in the same layer as one of the first touch electrode layer TML1 and the second touch electrode layer TML2 in FIG. 5. In detail, the output pad OPD may be disposed in the same layer as the second touch electrode layer TML2. In another exemplary embodiment of the invention, the data pad pattern DPP may be selectively omitted.

The output pad lines OPL and the test pad lines TPL may be disposed in the same layer as the gate pad pattern GPP and electrically connected to the gate pad pattern GPP.

A second opening OP2 exposing at least a portion of the gate pad pattern GPP is defined in the interlayer insulation film ILD, and the gate pad pattern GPP and the data pad pattern DPP contact each other through the second opening OP2.

A third opening OP3 exposing at least a portion of the data pad pattern DPP is defined in the first touch insulation layer TSL1 and the second touch insulation layer TSL2, and the output pad OPD and the data pad pattern DPP contact each other through the third opening OP3.

In an exemplary embodiment of the invention, the first touch insulation layer TSL1 and the second touch insulation layer TSL2 include the substantially same material as each other, and the groove patterns having the same shape as each other are defined in the first touch insulation layer TSL1 and the second touch insulation layer TSL2. Accordingly, hereinafter, the first touch insulation layer TSL1 and the second touch insulation layer TSL2 will be described as a touch insulation layer TSL instead of being separately described. A wording that the groove pattern is defined in the touch insulation layer TSL represents that the recesses pattern is defined in each of the first touch insulation layer TSL1 and the second touch insulation layer TSL2, for example.

Figure 8:
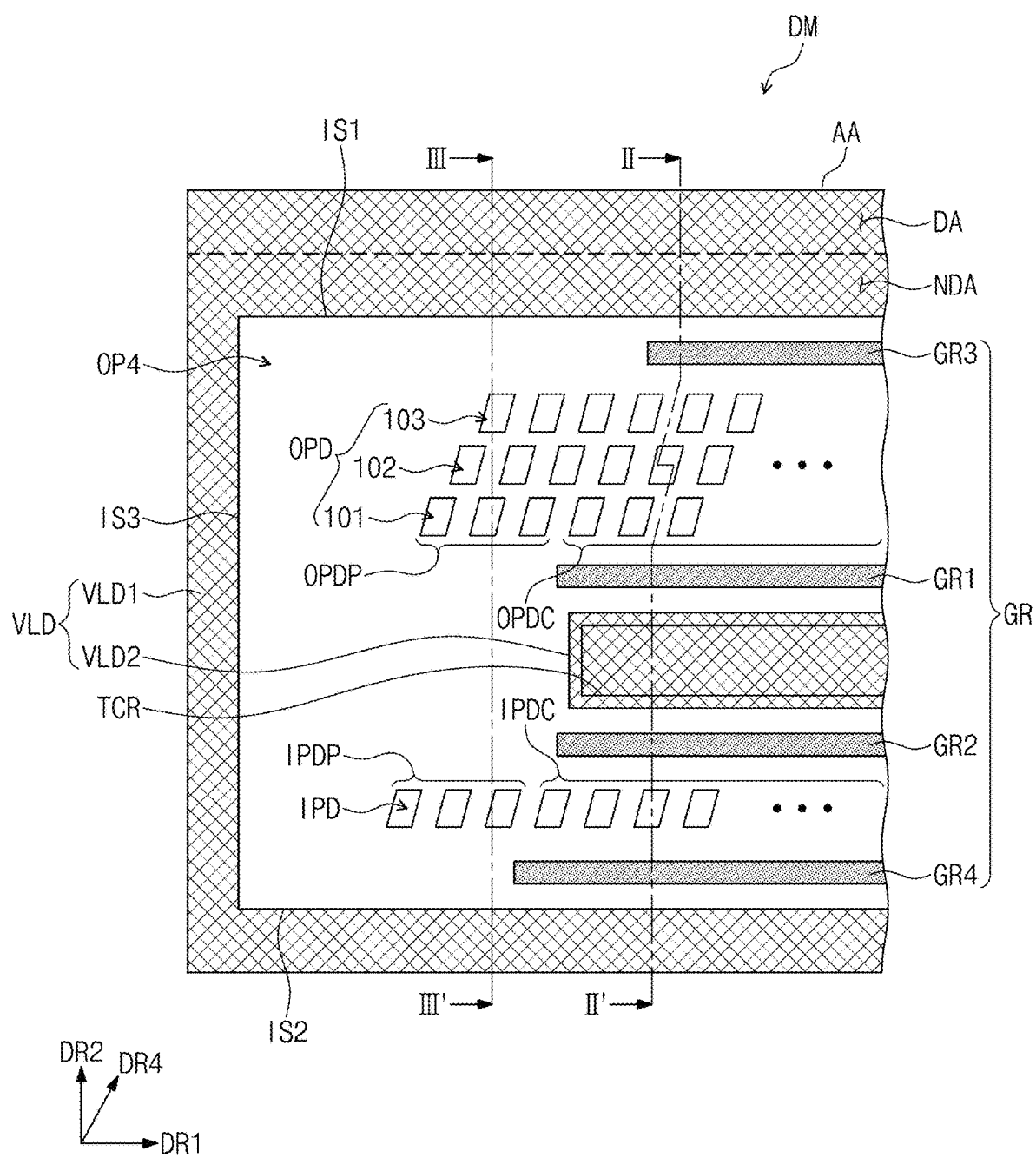
FIG. 8 is a view illustrating an exemplary embodiment of a shape of a groove pattern according to the invention in an enlarged plan view of the area AA in FIG. 1.
Figure 9:
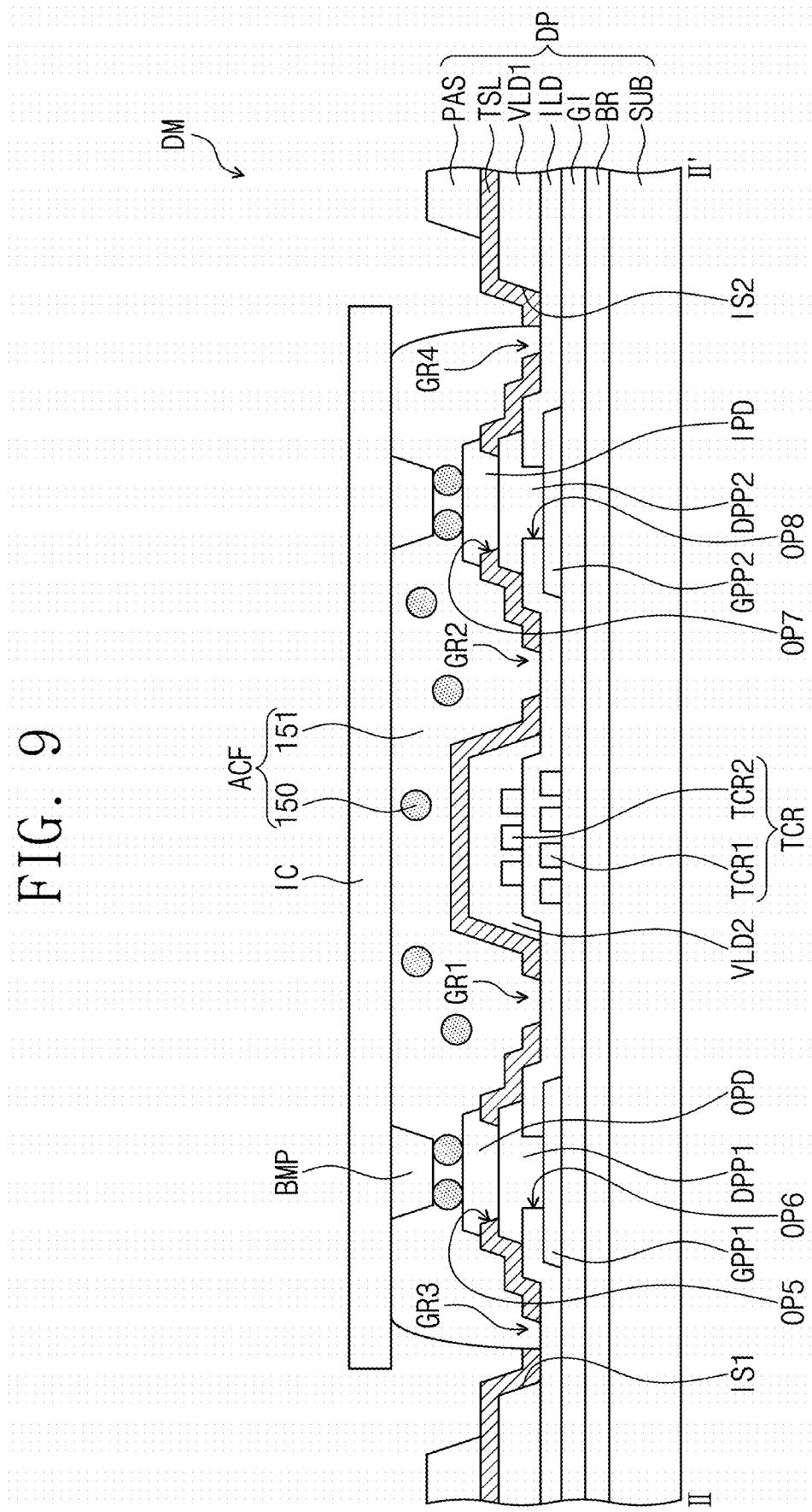
FIG. 9 is a cross-sectional view taken along line II-II' of FIG. 8.

FIG. 8 is a view illustrating a shape of a groove pattern according to an exemplary embodiment of the invention in an enlarged plan view of the area AA in FIG. 1, and FIG. 9 is a cross-sectional view taken along line II-II' in FIG. 8.

Referring to FIGS. 8 and 9, the output pads OPD may include central output pads OPDC and outer output pads OPDP. The outer output pads OPDP may be disposed outside the central output pads OPDC.

Although the outer output pads OPDP is disposed at one outside of the central output pads OPDC in the first direction DR1 in FIG. 8, the outer output pads OPDP may be disposed at the other outside of the central output pads OPDC in the first direction DR1.

In a plan view, a predetermined number of the outer output pads OPDP may not overlap the test circuit TCR in the second direction DR2. In the plan view, the central output pads OPDC may overlap the test circuit TCR in the second direction DR2.

The output pads OPD are exemplarily disposed in three rows in an exemplary embodiment of the invention. The output pads OPD may be classified into first to third row output pads 101, 102, and 103 in an order adjacent to the test circuit TCR.

Although the outer output pads OPDP are exemplarily illustrated as output pads disposed from the first row that is the outermost row to the third row in FIG. 8, the invention is not limited thereto. In an exemplary embodiment, the number of the outer output pads OPDP may be variously set, for example.

Also, the input pads IPD may include central input pads IPDC and outer input pads IPDP. The outer input pads IPDP may be disposed outside the central input pads IPDC.

In a plan view, at least a predetermined number of the outer input pads IPDP may not overlap the test circuit TCR in the second direction DR2. In the plan view, the central input pads OPDC may overlap the test circuit TCR in the second direction DR2.

Although the outer input pads IPDP are exemplarily illustrated as input pads disposed from the first row that is the outermost row to the third row in FIG. 8, the invention is not limited thereto. In an exemplary embodiment the number of the outer input pads IPDP may be variously set, for example.

A groove pattern GR is defined in the touch insulation layer TSL. The groove pattern GR may be a hole passing through the touch insulation layer TSL. However, the invention is not limited thereto. In an exemplary embodiment, the groove pattern GR may pass through the touch insulation layer TSL and define a groove in the interlayer insulation film ILD, for example.

The groove pattern GR may overlap the non-display area NDA in the plan view and be defined around the pad group PDG (refer to FIG. 6). The groove pattern GR may overlap the driving circuit chip IC in the plan view.

In the plan view, the groove pattern GR may be disposed between the central output pads OPDC and the intermediate insulation layer VLD. In other words, in the plan view, a distance between the groove pattern GR and the central output pads OPDC may be shorter than that between the central output pads OPDC and the intermediate insulation layer VLD. The groove pattern GR may overlap at least a predetermined number of the central output pads OPDC. The groove pattern GR may not overlap at least a predetermined number of the outer output pads OPDP.

Hereinafter, the shape of the groove pattern GR will be described.

The intermediate insulation layer VLD may include a first intermediate insulation layer VLD1 and a second intermediate insulation layer VLD2.

The first intermediate insulation layer VLD1 and the second intermediate insulation layer VLD2 may be spaced apart from each other. In the plan view, the second intermediate insulation layer VLD2 may be disposed between the output pads OPD and the input pads IPD in the second direction DR2. The second intermediate insulation layer VLD2 may overlap the driving circuit chip IC (refer to FIG. 6) and cover the test circuit TCR (refer to FIG. 6). The first intermediate insulation layer VLD1 may be the remaining portion except for the second intermediate insulation layer VLD2.

A fourth opening OP4 is defined in the first intermediate insulation layer VLD1, and the pad group PDG is exposed through the fourth opening OP4. The fourth opening OP4 may have a rectangular shape that is similar to a planar shape of the driving circuit chip IC. The fourth opening OP4 having the rectangular shape has first to fourth inside surfaces. In FIG. 8, a first inside surface IS1 adjacent to the display area DA and extending in the first direction DR1, a second inside surface IS2 in parallel to the first inside surface IS1, and a third inside surface IS3 connecting the first inside surface IS1 to the second inside surface IS2 are illustrated. Although a fourth inside surface (not shown) is not shown, the fourth inside surface may face the third inside surface IS3 and connect the first and second inside surfaces IS1 and IS2 to each other.

In an exemplary embodiment of the invention, the groove pattern GR may include first to fourth groove patterns GR1 to GR4.

In the plan view, the first groove pattern GR1 may pass-through between the central output pads OPDC and the second intermediate insulation layer VLD2. The first groove pattern GR1 may have a linear shape extending in the first direction DR1. The first groove pattern GR1 may not overlap a predetermined number of the outer output pads OPDP in the second direction DR2. In FIG. 8, the first groove pattern GR1 exemplarily does not overlap all of the output pads 101, which are disposed in the first row, of the outer output pads OPDP in the second direction DR2. The first groove pattern GR1 may overlap all of the central output pads OPDC in the second direction DR2.

In the plan view, the second groove pattern GR2 may pass-through between the central input pads IPDC and the second intermediate insulation layer VLD2. The second groove pattern GR2 may have a linear shape extending in the first direction DR1. The second groove pattern GR2 may not overlap a predetermined number of the outer input pads IPDP in the second direction DR2. In FIG. 8, the second groove pattern GR2 exemplarily dose not overlap all of the outer input pads IPDP in the second direction DR2. The second groove pattern GR2 may overlap all of the central input pads IPDC in the second direction DR2.

In the plan view, the third groove pattern GR3 may pass-through between the central output pads OPDC and the first inside surface IS1 of the first intermediate insulation layer VLD1. The third groove pattern GR3 may have a linear shape extending in the first direction DR1. The third groove pattern GR3 may not overlap a predetermined number of the outer output pads OPDP in the second direction DR2. In FIG. 8, the third groove pattern GR3 exemplarily dose not overlap all of the outer output pads OPDP in the second direction DR2. The third groove pattern GR3 may overlap at least a predetermined number of the central output pads OPDC in the second direction DR2. In FIG. 8, the third groove pattern GR3 exemplarily overlaps all of the output pads 103, which are disposed in the third row, of the outer output pads OPDP in the second direction DR2.

In the plan view, the fourth groove pattern GR3 may pass-through between the central input pads IPDC and the second inside surface IS2 of the first intermediate insulation layer VLD1. The fourth groove pattern GR4 may have a linear shape extending in the first direction DR1. The fourth groove pattern GR4 may not overlap a predetermined number of the outer output pads OPDP in the second direction DR2. In FIG. 8, the fourth groove pattern GR4 exemplarily dose not overlap all of the outer input pads IPDP in the second direction DR2. The fourth groove pattern GR4 may overlap at least a predetermined number of the central input pads IPDC in the second direction DR2.

The interlayer insulation film ILD (refer to FIG. 9) may be exposed by the first to fourth groove patterns GR1 to GR4.

In FIG. 9, although the first to fourth groove patterns GR1 to GR4 are exemplarily defined in the touch insulation layer TSL, the invention is not limited thereto. In an exemplary embodiment, the first to fourth groove patterns GR1 to GR4 may extend to be defined in a portion of the interlayer insulation film ILD, for example.

Referring to FIG. 9, the display apparatus DM may further include a bump BMP. The bump BMP may be attached to one surface of the driving circuit chip IC, which faces the display panel DP. The bump BMP may include a conductive material. The driving circuit chip IC may receive a voltage and current signal through the bump BMP.

The driving circuit chip IC may be disposed (e.g., mounted) in such a manner that an anisotropic conductive film ("ACF") is disposed between the driving circuit chip IC and the display panel DP and then thermally compressed at a high temperature. The ACF may include a plurality of conductive balls 150 and an adhesive material 151. The conductive ball 150 may allow the bump BMP and the input and output pads IPD and OPD to be electrically connected to each other.

In FIG. 9, the output pad OPD contacts an output data pad pattern DPP1 through a fifth opening OP5 defined in the touch insulation layer TSL, and the output data pad pattern DPP1 contacts an output gate pad pattern GPP1 through a sixth opening OP6 defined in the interlayer insulation film ILD.

The input pad IPD contacts an input data pad pattern DPP2 through a seventh opening OP7 defined in the touch insulation layer TSL, and the input data pad pattern DPP2 contacts an input gate pad pattern GPP2 through an eighth opening OP8 defined in the interlayer insulation film ILD.

Since the structures of the output pad OPD and the input pad IPD have been described with reference to FIG. 7, detailed description will be omitted.

In FIG. 9, the test circuit TCR may include at least one of a first test pattern TCR1 and a second test pattern TCR2. The first test pattern TCR1 may be disposed in the same layer as the output gate pad pattern GPP1 and the input gate pad pattern GPP2. The second test pattern TCR2 may be disposed in the same layer as the output data pad pattern DPP1 and the input data pad pattern DPP2.

Figure 10:
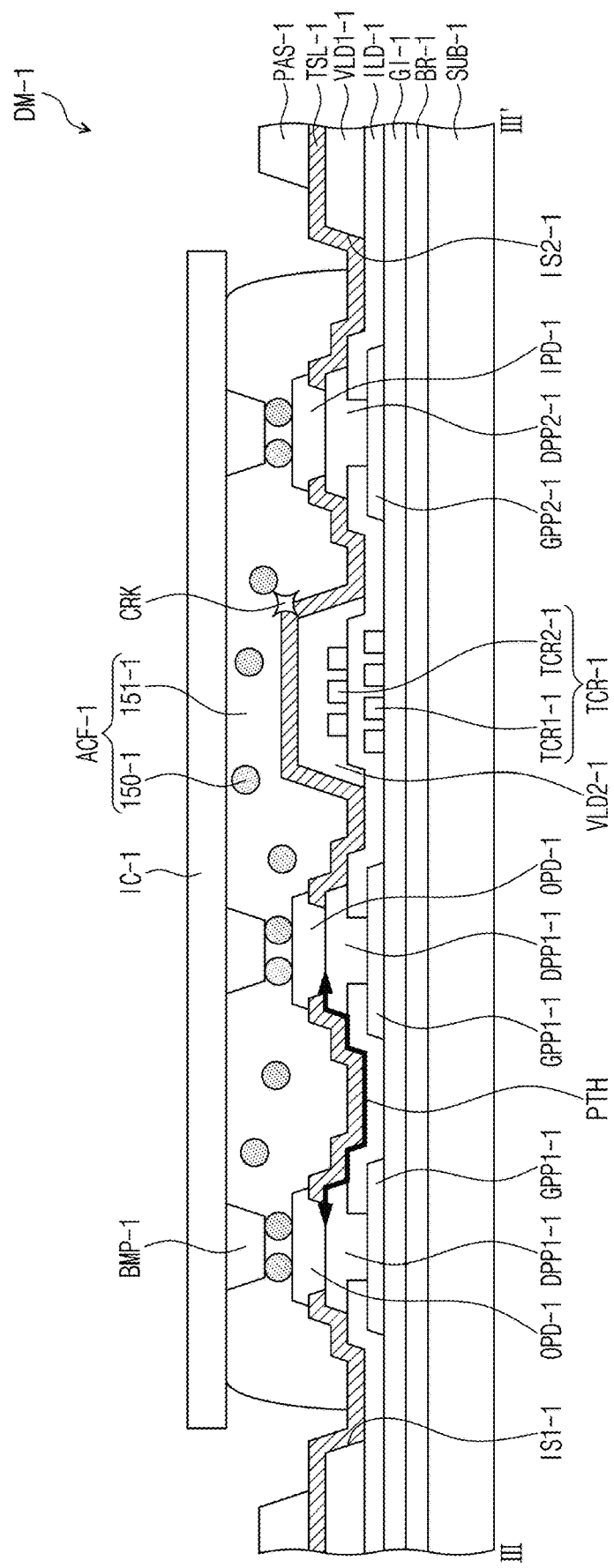
FIG. 10 is a view exemplarily illustrating a comparative example of a cross-section of a display apparatus.
Figure 11:
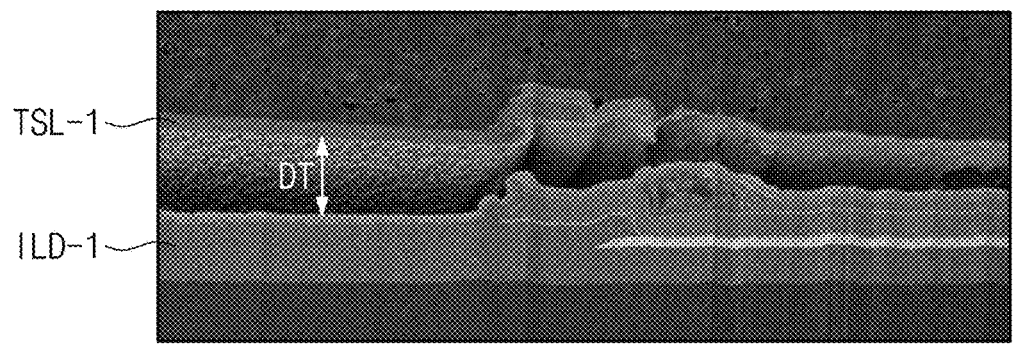
FIG. 11 is a photograph showing the comparative example of a cross-section of the display apparatus.
Figure 12:
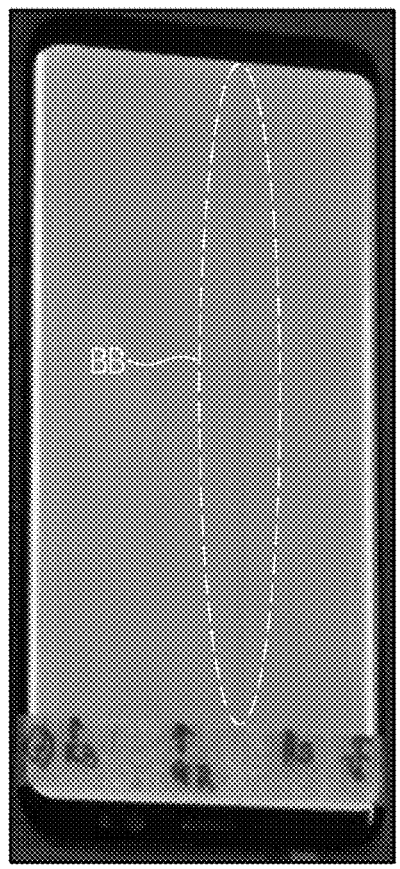
FIG. 12 is a photograph showing a defect generated in a mobile terminal to which the comparative example of the display apparatus is applied.

FIG. 10 is a view exemplarily illustrating a cross-section of a display apparatus corresponding to a comparative example, FIG. 11 is a photograph showing the cross-section of the display apparatus corresponding to the comparative example, and FIG. 12 is a photograph showing a defect occurred in a mobile terminal to which the display apparatus corresponding to the comparative example is applied.

It is assumed that FIG. 10 has the substantially same structure as that in FIG. 9 except for the groove pattern GR in FIG. 9. FIG. 10 is a cross-sectional view taken along line III-III' of FIG. 8. A component, which corresponds to that of the display apparatus in FIG. 9, of components in FIG. 10 is indicated by adding "-1" to the reference symbol of the corresponding component of the display apparatus in FIG. 9.

Since each of an interlayer insulation film ILD-1 and a touch insulation layer TSL-1 includes an inorganic material, each of an interlayer insulation film ILD-1 and a touch insulation layer TSL-1 has a relatively weak coupling force. Accordingly, the touch insulation layer TSL-1 and the interlayer insulation film ILD-1 are easily delaminated from each other.

In detail, a crack CRK may be generated in the touch insulation layer TSL-1. The crack CRK may be generated due to various reasons. While a process of compressing a driving circuit chip IC-1 is preformed, a conductive ball 150-1 may apply a pressure to the touch insulation layer TSL-1 to generate the crack CRK in the touch insulation layer TSL-1, for example. Also, as the flexible display panel DP (refer to FIG. 9) is bent, the touch insulation layer TSL-1 may be also bent to generate the crack therein.

In a circumstance having a high temperature and high moisture, as an intermediate insulation layer VLD-1 including an organic material absorbs moisture through the crack CRK and is thermally expanded, the touch insulation layer TSL-1 and the interlayer insulation film ILD-1 are delaminated. FIG. 11 shows that the touch insulation layer TSL-1 and the interlayer insulation film ILD-1 are delaminated by a first distance DT.

A fluid path PTH through which moisture may pass between the touch insulation layer TSL-1 and the interlayer insulation film ILD-1 may be defined, and, as the moisture moves through the fluid path PTH, pads adjacent to each other may be short-circuited. In particular, since the display panel DP has a high resolution, and thus the spaced distance between the output pads OPD becomes narrow, the output pads OPD may be short-circuited through the output pads OPD adjacent to each other. In FIG. 10, two adjacent output pads OPD-1 are exemplarily short-circuited.

Referring to area BB in FIG. 12, adjacent output pads OPD are short-circuited to generate a defect having a vertical line shape. The display apparatus DM-1 corresponding to the comparative example may have various kinds of defects according to a combination of the input and output pads IPD and OPD in addition to the defect having a vertical line shape in FIG. 12.

Referring back to FIGS. 8 and 9, as the groove pattern GR is defined in the touch insulation layer TSL, the display apparatus DM according to an exemplary embodiment of the invention may fundamentally prevent a delamination phenomenon between the touch insulation layer TSL and the interlayer insulation film ILD or prevent the delamination phenomenon generated between the touch insulation layer TSL and the interlayer insulation film ILD from being transferred to the input pad IPD and the output pad OPD.

The intermediate insulation layer VLD has a thickness relatively greater than that of layers disposed therebelow except for the substrate SUB. In an exemplary embodiment, the intermediate insulation layer VLD may have a thickness equal to or greater than about 10000 angstroms (Å), and each of the barrier layer BR, the active layer ACT, the gate insulation layer GI, the gate electrode GE, the interlayer insulation film ILD, and the input and output electrodes SE and DE may have a thickness equal to or less than about 10000 Å, for example.

Since the intermediate insulation layer VLD has a relatively thick thickness and the touch insulation layer TSL has a relatively thin thickness, the touch insulation layer TSL overlapping the first to third inside surfaces IS1 to IS3 and the fourth inside surface (not shown) is relatively vulnerable to the crack. Also, the crack may be generated in the touch insulation layer TSL overlapping the driving circuit chip IC due to the pressure of the conductive ball 150 during the compression process of the driving circuit chip IC. That is, there is a high possibility that the crack is generated in the touch insulation layer TSL at a position in which the touch insulation layer TSL overlaps the intermediate insulation layer VLD. Accordingly, in an exemplary embodiment of the invention, the groove pattern GR is defined in a position overlapping the intermediate insulation layer VLD to prevent the delamination phenomenon between the touch insulation layer TSL and the interlayer insulation film ILD due to the crack generated in the touch insulation layer TSL from being transferred to the output pads OPD and the input pads IPD.

In the display apparatus according to an exemplary embodiment of the invention, as the groove pattern is defined in the touch insulation layer, the short-circuit caused by the delamination phenomenon between the touch insulation layer TSL and the interlayer insulation film ILD may be prevented from being generated between the output pads OPD and the input pads IPD.

Referring back to FIGS. 8 and 9, since the pads are disposed on both sides of each of the central output pads OPDC and the central input pads IPDC in the first direction DR1, the stress applied to the central output pads OPDC and the central input pads IPDC when the driving circuit chip IC is disposed (e.g., mounted) on the display panel DP may be distributed. However, in case of the outer output pads OPDP and the outer input pads IPDP, since the pads are disposed at only one side in the first direction DR1, a stress is concentrated thereon in comparison with the central output pads OPDC and the central input pads IPDC.

Since the groove pattern is vulnerable to the stress, when the crack is generated in the groove pattern, the crack may be generated over the entire display panel along the groove pattern. In particular, when the groove pattern is defined around the area in which the outer output pads OPDP and the outer input pads IPDP, which are area to which the stress is concentrated, are disposed, the crack may be generated along the groove pattern in the process of mounting the driving circuit chip IC to generate a defect of the display apparatus.

In the display apparatus according to an exemplary embodiment of the invention, as the groove pattern is defined in the touch insulation layer, the delamination limitation between the touch insulation layer TSL and the interlayer insulation film ILD may be solved, and, at the same time, as the groove pattern does not overlap at least a predetermined number of the outer output pads OPDP and at least a predetermined number of the outer input pads IPDP in the second direction DR2 to allow the stress to be concentrate on the area in which outer output pads OPDP and the outer input pads IPDP are disposed, the limitation in which the crack is generated in the display panel may be solved.

Figure 13:
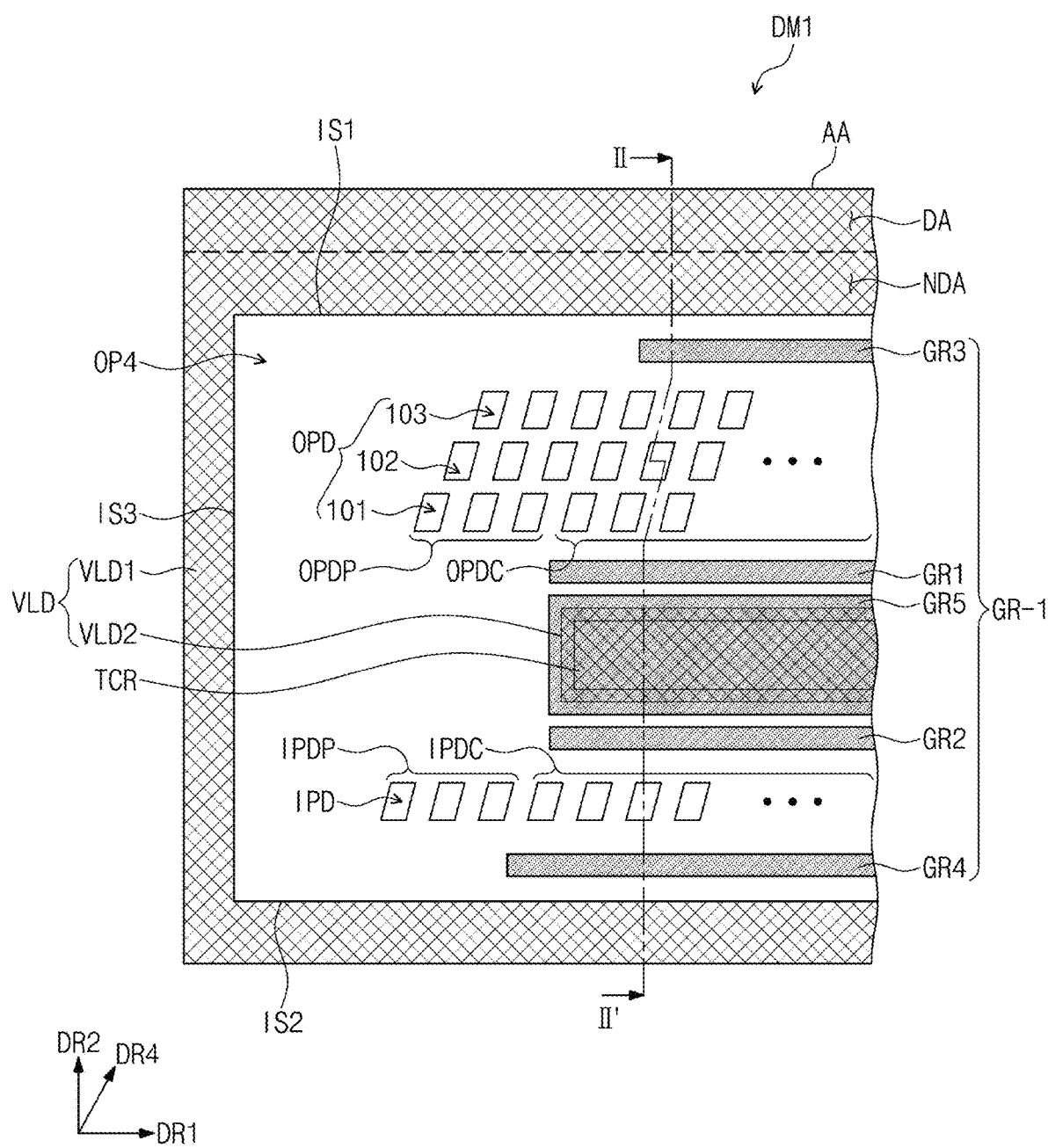
FIG. 13 is a view illustrating another exemplary embodiment of a shape of a groove pattern according to the invention in the enlarged plan view of the area AA in FIG. 1.
Figure 14:
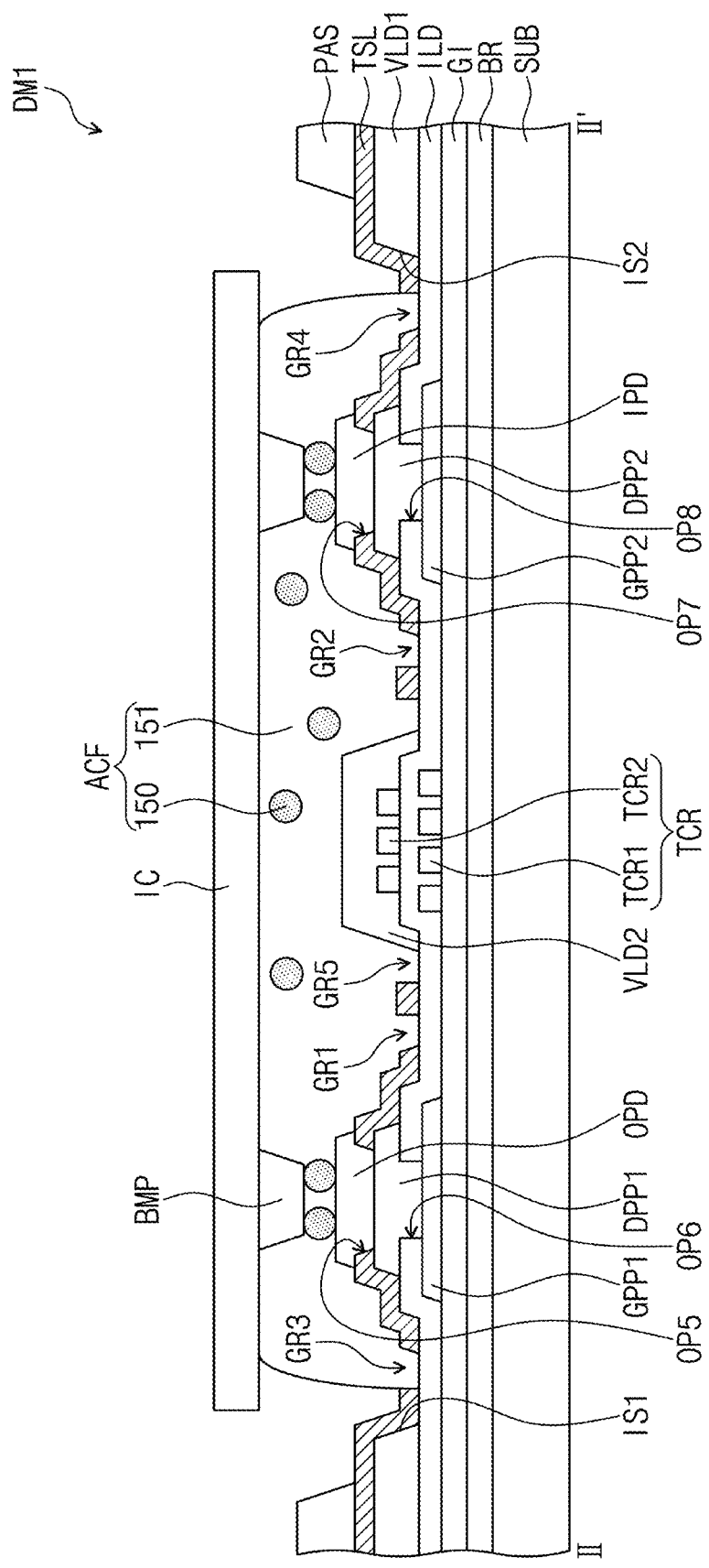
FIG. 14 is a cross-sectional view taken along line II-II' of FIG. 13.

FIG. 13 is a view illustrating a shape of a groove pattern according to another exemplary embodiment of the invention in an enlarged plan view of the area AA in FIG. 1, and FIG. 14 is a cross-sectional view taken along line II-II' in FIG. 13.

A display apparatus DM1, which will be described with reference to FIGS. 13 and 14, according to another exemplary embodiment of the invention includes the substantially same components as those of the display apparatus DM, which has been described with reference to FIGS. 8 and 9, according to an exemplary embodiment of the invention, except for a shape of a groove pattern GR-1. Hereinafter, the shape of the groove pattern GR-1 will be described in detail, and components that are not described will follow the description of FIGS. 8 and 9.

The groove pattern GR-1 may further include a fifth groove pattern GR5.

The fifth groove pattern GR5 is disposed between the first and second groove patterns GR1 and GR2 and spaced apart from the first and second groove patterns GR1 and GR2 in the second direction DR2. The fifth groove pattern GR5 exposes the second intermediate insulation layer VLD2 and the interlayer insulation film ILD. That is, the touch insulation layer TSL does not overlap the second intermediate insulation layer VLD2.

The fifth groove pattern GR5 fundamentally prevent a crack from being generated around the second intermediate insulation layer VLD2.

Figure 15:
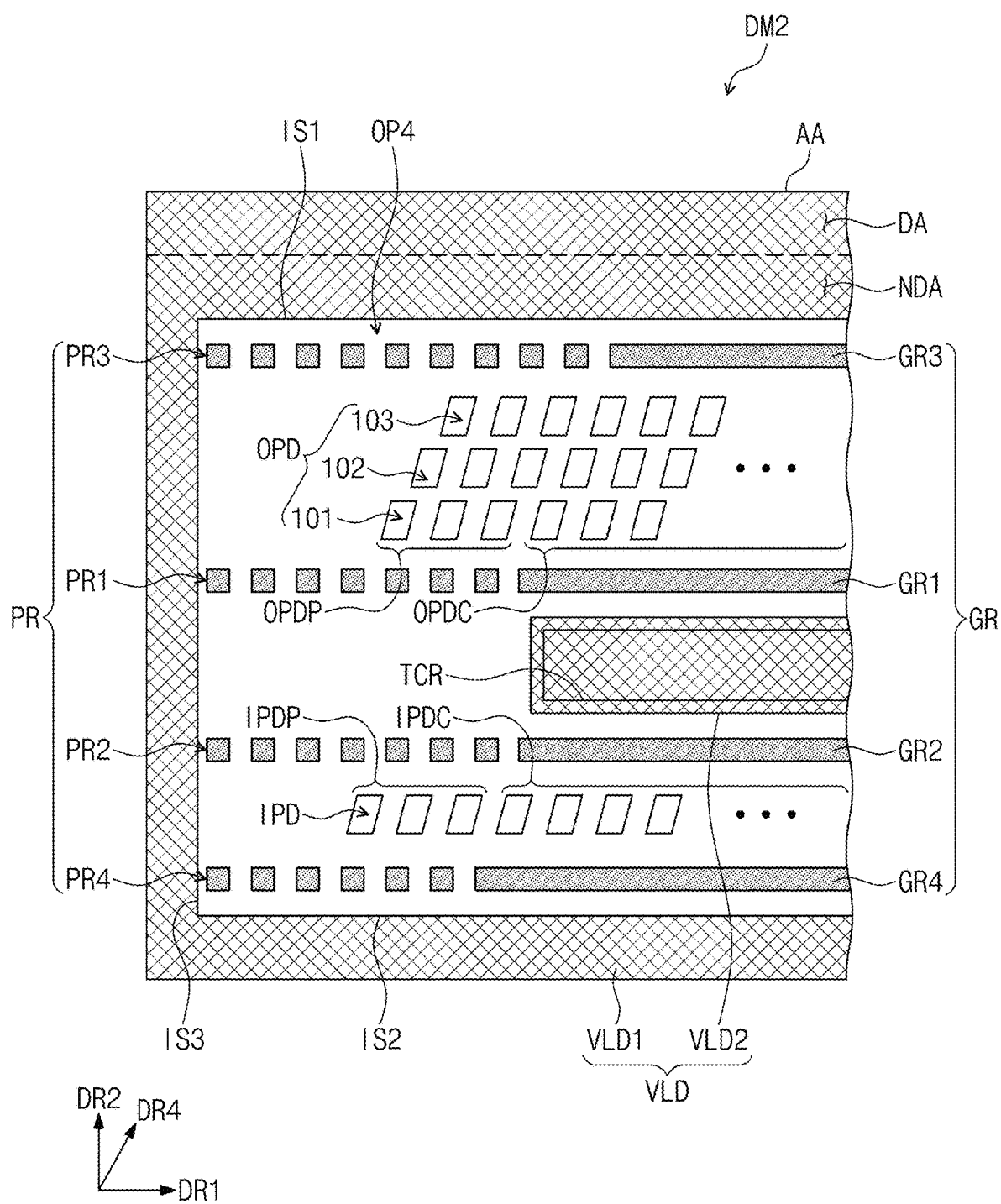
FIG. 15 is a view illustrating another exemplary embodiment of a shape of a groove pattern according to the invention in the enlarged plan view of the area AA in FIG. 1.

FIG. 15 is a view illustrating a shape of a groove pattern according to another exemplary embodiment of the invention in an enlarged plan view of the area AA in FIG. 1.

A display apparatus DM2, which will be described with reference to FIG. 15, according to another exemplary embodiment of the invention, includes the substantially same components as those of the display apparatus DM, which has been described with reference to FIGS. 8 and 9, according to an exemplary embodiment of the invention, except for an outer groove pattern PR. Hereinafter, the groove pattern PR will be described in detail, and components that are not described will follow the description of FIGS. 8 and 9.

The outer groove pattern PR may be further defined in the touch insulation layer TSL (refer to FIG. 9). The outer groove pattern PR may include a plurality of holes disposed in parallel in a specific direction. The plurality of holes may pass through the touch insulation layer TSL and define a groove in the interlayer insulation film ILD after passing through the touch insulation layer TSL. The plurality of holes may have the substantially the same cross-sectional shape (depth) as that of the groove pattern GR.

The outer groove pattern PR may include first to fourth outer groove patterns PR1 to PR4.

The first to fourth outer groove patterns PR1 to PR4 may be disposed adjacent to the first to fourth groove patterns GR1 to GR4 in the first direction DR1, respectively.

Each of the first to fourth outer groove patterns PR1 to PR4 may include a plurality of holes that area spaced apart from each other in the first direction DR1. The first to fourth outer groove patterns PR1 to PR4 may overlap the outer output pads OPDP and the outer input pads IPDP in the second direction DR2.

According to the display apparatus described with reference to FIG. 15, as the first to fourth outer groove patterns PR1 to PR4 are disposed in an area overlapping the outer output pads OPDP and the outer input pads IPDP in the second direction DR2, the delamination limitation between the touch insulation layer TSL (refer to FIG. 9) and the interlayer insulation film ILD (refer to FIG. 9) may be solved, and, at the same time, as the stress applied to an area, in which the outer output pads OPDP and the outer input pads IPDP are disposed, is distributed, the limitation of crack occurrence in the display panel may be solved.

Figure 16:
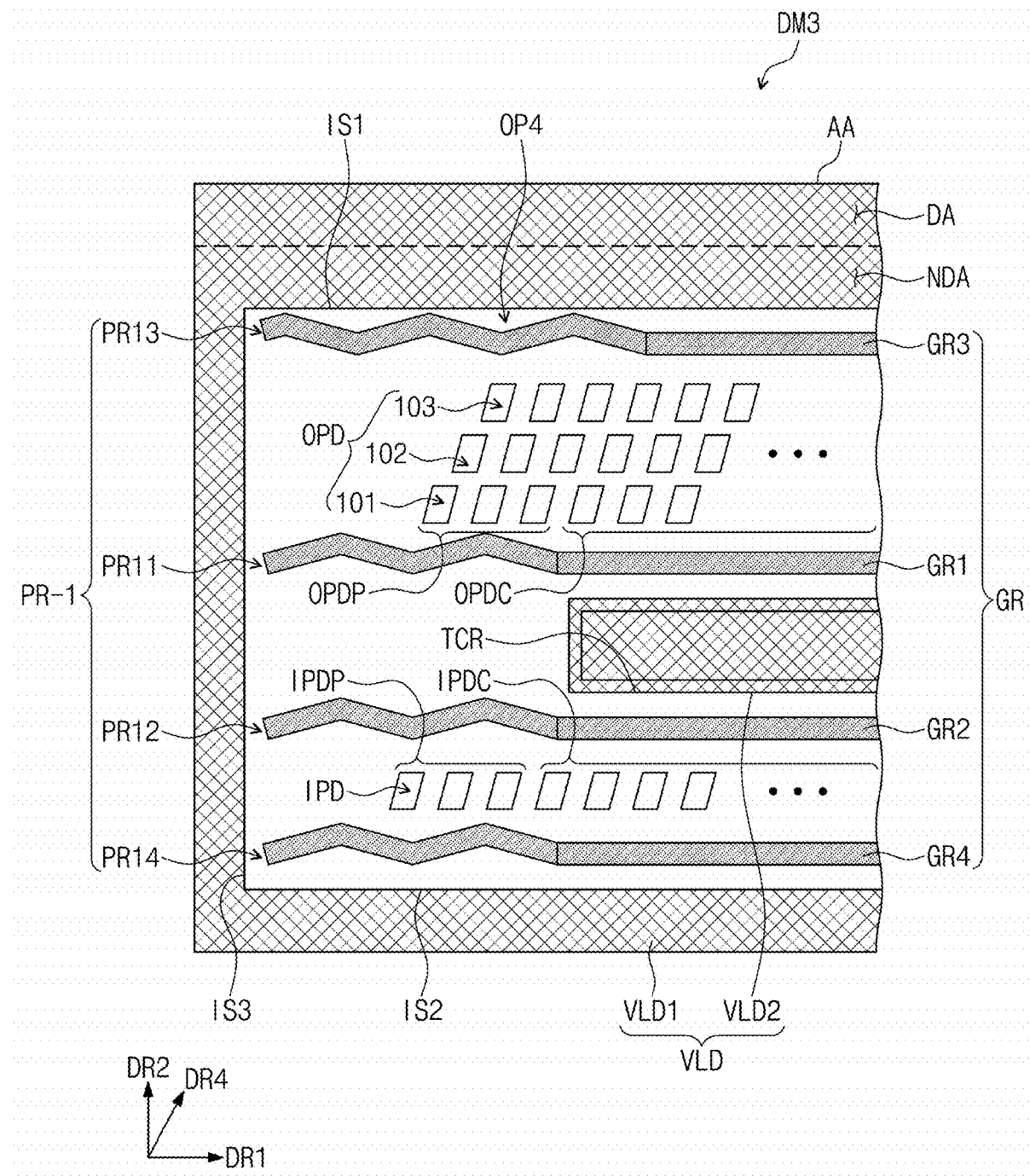
FIG. 16 is a view illustrating another exemplary embodiment of a shape of a groove pattern according to the invention in the enlarged plan view of the area AA in FIG. 1.

FIG. 16 is a view illustrating a shape of a groove pattern according to another exemplary embodiment of the invention in an enlarged plan view of the area AA in FIG. 1.

A display apparatus DM3, which will be described with reference to FIG. 16, according to another exemplary embodiment of the invention, includes the substantially same components as those of the display apparatus DM, which has been described with reference to FIGS. 8 and 9, according to an exemplary embodiment of the invention, except for an outer groove pattern PR-1. Hereinafter, the groove pattern PR-1 will be described in detail, and components that are not described will follow the description of FIGS. 8 and 9.

The outer groove pattern PR-1 may be further defined in the touch insulation layer TSL (refer to FIG. 9). The outer groove pattern PR-1 may has a shape extending in a zig-zag manner along the first direction. The outer groove pattern PR-1 may pass through the touch insulation layer TSL and define a groove in the interlayer insulation film ILD (refer to FIG. 9). The plurality of holes may have the substantially the same cross-sectional shape (depth) as that of the groove pattern GR.

The outer groove pattern PR-1 may include first to fourth outer groove patterns PR11 to PR14.

The first to fourth outer groove patterns PR11 to PR14 may be disposed adjacent to the first to fourth groove patterns GR1 to GR4 in the first direction DR1, respectively. In FIG. 16, although the first to fourth outer groove patterns PR11 to PR14 are exemplarily connected to the first to fourth groove patterns GR1 to GR4, respectively, the invention is not limited thereto. In an exemplary embodiment, the first to fourth outer groove patterns PR11 to PR14 may be spaced apart from the first to fourth groove patterns GR1 to GR4, respectively, in the first direction DR1, for example.

Each of the first to fourth outer groove patterns PR11 to PR14 may have a shape in which linear patterns extending direction different from each other are connected to each other. However, the invention is not limited thereto. In an exemplary embodiment, each of the first to fourth outer groove patterns PR11 to PR14 may have a shape in which curved patterns are connected to each other, for example.

According to the display apparatus DM3 described with reference to FIG. 16, as the first to fourth outer groove patterns PR11 to PR14 are disposed in the area overlapping the outer output pads OPDP and the outer input pads IPDP in the second direction DR2, the delamination limitation between the touch insulation layer TSL and the interlayer insulation film ILD may be solved, and, at the same time, as the stress applied to the area, in which the outer output pads OPDP and the outer input pads IPDP are disposed, is distributed, the limitation of crack occurrence in the display panel may be solved.

Figure 17:
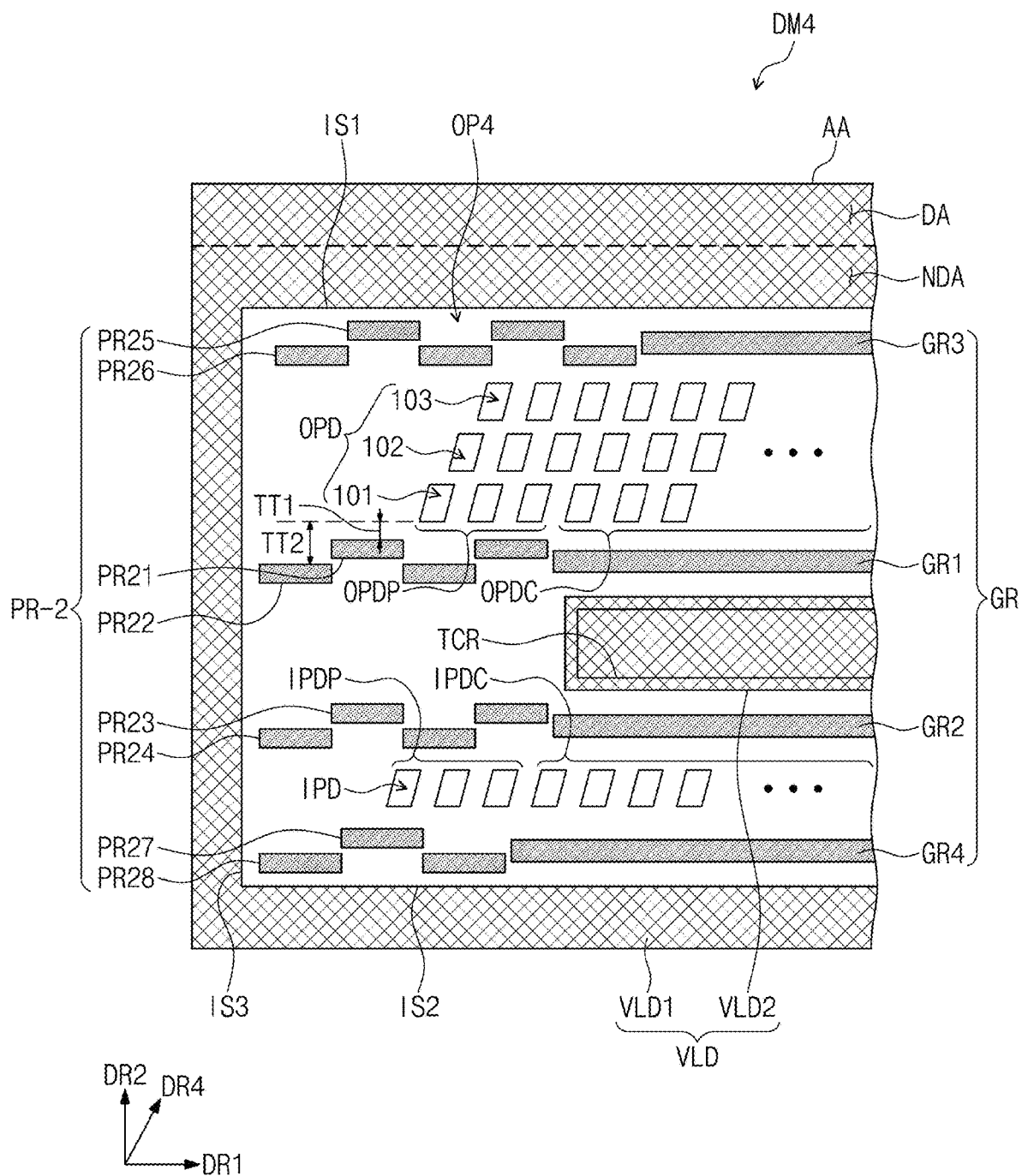
FIG. 17 is a view illustrating another exemplary embodiment of a shape of a groove pattern according to the invention in the enlarged plan view of the area AA in FIG. 1.

FIG. 17 is a view illustrating a shape of a groove pattern according to another exemplary embodiment of the invention in an enlarged plan view of the area AA in FIG. 1.

A display apparatus DM4, which will be described with reference to FIG. 17, according to another exemplary embodiment of the invention, includes the substantially same components as those of the display apparatus DM, which has been described with reference to FIGS. 8 and 9, according to an exemplary embodiment of the invention, except for an outer groove pattern PR-2. Hereinafter, the groove pattern PR-2 will be described in detail, and components that are not described will follow the description of FIGS. 8 and 9.

The outer groove pattern PR-2 may be further defined in the touch insulation layer TSL (refer to FIG. 9).

The outer groove pattern PR-2 may include first to eighth outer groove patterns PR21 to PR28. Each of the first to eighth outer groove patterns PR21 to PR28 may be provided in plurality.

The first and second outer groove patterns PR21 to PR22 may be disposed between the second intermediate insulation layer VLD2 and the outer output pads OPDP. The first and second outer groove patterns PR21 and PR22 may overlap the outer output pads OPDP in the second direction DR2. The first outer groove patterns PR21 may be spaced apart from each other in the first direction DR1. The second outer groove patterns PR22 may be spaced apart from each other in the first direction DR1.

The first and second outer groove patterns PR21 and PR22 may have different distances spaced from the output pads disposed in any one row in the second direction DR2. With reference to the output pads OPD disposed in the first row, the first outer groove patterns PR21 may be spaced by a first distance TT1, and the second outer groove patterns PR22 may be spaced by a second distance TT2.

The first outer groove patterns PR21 may be disposed between the second outer groove patterns PR22 in the first direction DR1.

The third and fourth outer groove patterns PR23 and PR24 may be disposed between the second intermediate insulation layer VLD2 and the outer input pads IPDP. The third and fourth outer groove patterns PR23 and PR24 may overlap the outer input pads IPDP in the second direction DR2. The third outer groove patterns PR23 may be spaced apart from each other in the first direction DR1, and the fourth outer groove patterns PR24 may be spaced apart from each other in the first direction DR1.

The third and fourth outer groove patterns PR23 and PR24 may have different distances spaced from the output pads disposed in any one row in the second direction DR2.

The third outer groove patterns PR23 may be disposed between the fourth outer groove patterns PR24 in the first direction DR1.

The fifth and sixth outer groove patterns PR25 and PR26 may be disposed between the outer output pads OPDP and the first inside surface IS1 of the first intermediate insulation layer VLD1. The fifth and sixth outer groove patterns PR25 and PR26 may overlap the outer output pads OPDP in the second direction DR2. The fifth outer groove patterns PR25 may be spaced apart from each other in the first direction DR1, and the sixth outer groove patterns PR26 may be spaced apart from each other in the first direction DR1.

The fifth and sixth outer groove patterns PR25 and PR26 may have different distances spaced from the output pads disposed in any one row in the second direction DR2.

The fifth outer groove patterns PR25 may be between the sixth outer groove patterns PR26 in the first direction DR1.

The seventh and eighth outer groove patterns PR27 and PR28 may be disposed between the outer input pads IPDP and the second inside surface IS2 of the first intermediate insulation layer VLD1. The seventh and eighth outer groove patterns PR27 and PR28 may overlap the outer input pads IPDP in the second direction DR2. The seventh outer groove patterns PR27 may be spaced apart from each other in the first direction DR1, and the eighth outer groove patterns PR28 may be spaced apart from each other in the first direction DR1.

The seventh and eighth outer groove patterns PR27 and PR28 may have different distances spaced from the output pads disposed in any one row in the second direction DR2. The seventh outer groove patterns PR27 may be disposed between the eighth outer groove patterns PR28 in the first direction DR1.

According to the display apparatus DM4 described with reference to FIG. 17, as the first to eighth outer groove patterns PR21 to PR28 are disposed in the area overlapping the outer output pads OPDP and the outer input pads IPDP in the second direction DR2, the delamination limitation between the touch insulation layer TSL and the interlayer insulation film ILD may be solved, and, at the same time, as the stress applied to the area, in which the outer output pads OPDP and the outer input pads IPDP are disposed, is distributed, the limitation of crack occurrence in the display panel may be solved.

Figure 18:
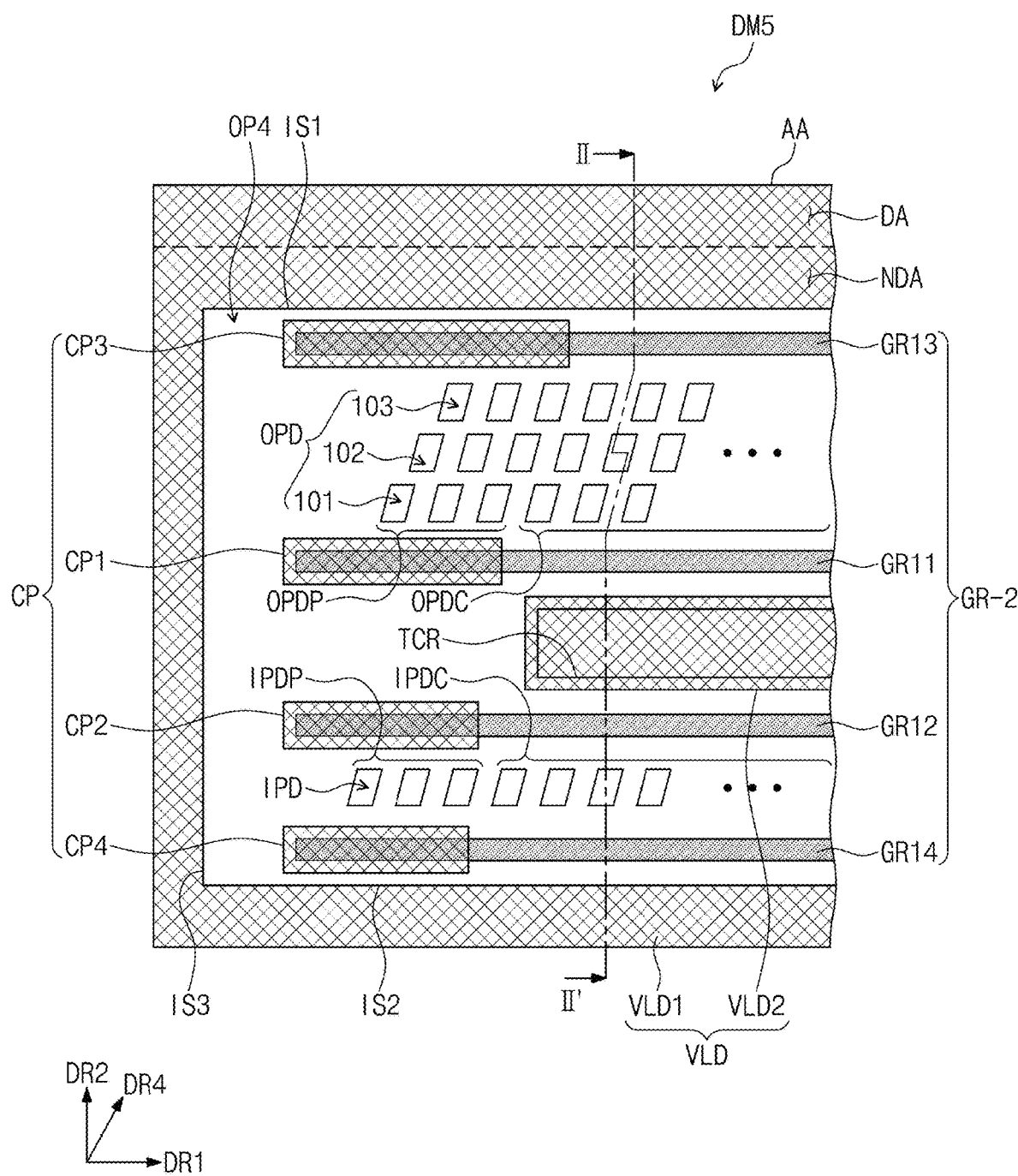
FIG. 18 is a view illustrating another exemplary embodiment of a shape of a groove pattern according to the invention in the enlarged plan view of the area AA in FIG. 1.
Figure 19:
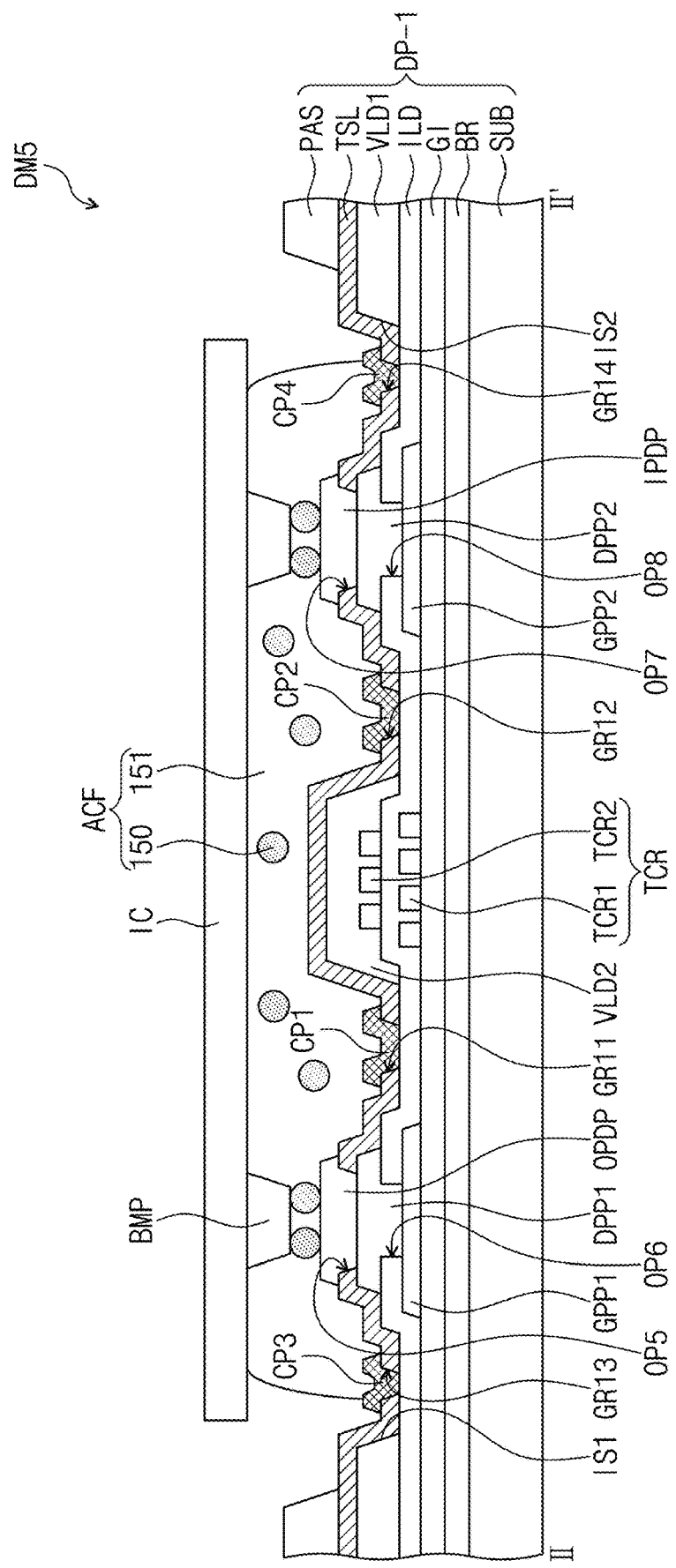
FIG. 19 is a cross-sectional view taken along line II-II' of FIG. 18.

FIG. 18 is a view illustrating a shape of a groove pattern according to another exemplary embodiment of the invention in an enlarged plan view of the area AA in FIG. 1, and FIG. 19 is a cross-sectional view taken along line II-II' in FIG. 18.

A display apparatus DM5, which will be described with reference to FIGS. 18 and 19, according to another exemplary embodiment of the invention includes the substantially same components as those of the display apparatus DM, which has been described with reference to FIGS. 8 and 9, according to an exemplary embodiment of the invention, except for a shape of a groove pattern GR-2 and a compensation pattern CP. Hereinafter, the shape of the groove pattern GR-2 and the compensation pattern CP will be described in detail, and components that are not described will follow the description of FIGS. 8 and 9.

The groove pattern GR-2 may include first to fourth groove patterns GR11 to GR14. Each of the first to fourth groove patterns GR11 to GR14 in FIG. 18 may have a shape in which each of the groove patterns GR1 to GR4 in FIG. 8 further extends.

In detail, each of the first to fourth groove patterns GR11 to GR14 may extend to the outer output pads OPDP and the outer input pads IPDP in the first direction DR1 and overlap the outer output pads OPDP and the outer input pads IPDP in the second direction DR2.

The display panel DP-1 may further include the compensation pattern CP. The compensation pattern CP may be disposed on the touch insulation layer TSL.

The compensation pattern CP may include first to fourth compensation patterns CP1 to CP4.

The first to fourth compensation patterns CP1 to CP4 may overlap the first to fourth groove patterns GR11 to GR14, respectively. The first to fourth compensation patterns CP1 to CP4 may prevent the interlayer insulation film ILD from being exposed by the first to fourth groove patterns GR11 to GR14, respectively.

The first to fourth compensation patterns CP1 to CP4 may overlap the outer output pads OPDP and the outer input pads IPDP in the second direction DR2.

Each of the first to fourth compensation patterns CP1 to CP4 may include the same material as that of the touch insulation layer TSL.

Partial areas of the first to fourth groove patterns GR11 to GR14 overlapping the outer output pads OPDP and the outer input pads IPDP in the second direction DR2 are covered by the first to fourth compensation patterns CP1 to CP4, respectively. Thus, in the display apparatus according to an exemplary embodiment of the invention, as the compensation pattern overlapping the groove patterns in the area overlapping the outer output pads OPDP and the outer input pads IPDP in the second direction DR2 are defined, the limitation, in which the crack is generated in the display panel because the stress is concentrated on the area in which the outer output pads OPDP and the outer input pads IPDP are disposed, may be solved.

In the display apparatus according to the exemplary embodiment of the invention, the short-circuit between the output pads and the input pads caused by the delamination phenomenon between the touch insulation layer and the interlayer insulation film is prevented by defining the groove pattern in the touch insulation layer.

In the display apparatus according to the exemplary embodiment of the invention, since the groove pattern is not extended to the pads disposed at the outer portion of the display panel, the crack generated due to the stress concentrated around the pads disposed at the outer portion of the display panel when the driving circuit chip is disposed (e.g., mounted) on the display panel may be prevented from being generated in the display panel.

Although the exemplary embodiments of the invention have been described, it is understood that the invention should not be limited to these exemplary embodiments but various changes and modifications may be made by one ordinary skilled in the art within the spirit and scope of the invention as hereinafter claimed.

Hence, the real protective scope of the invention shall be determined by the technical scope of the accompanying claims.

What is claimed is:

1. A display apparatus comprising:
  a substrate comprising a display area and a non-display area adjacent to the display area;
  a plurality of signal lines disposed on the substrate;
  a display element layer disposed on the plurality of signal lines and disposed on the display area;
  a plurality of first pads electrically connected to the plurality of signal lines and disposed on the non-display area; and
  an insulating layer disposed on the display element layer and defined a first groove pattern extended in a first direction and disposed on the non-display area;
  wherein the plurality of first pads comprises a plurality of first central pads and a plurality of first outer pads spaced apart from the plurality of first central pads in the first direction, and
  wherein the plurality of first central pads overlaps the first groove pattern in a second direction intersecting the first direction and the plurality of first outer pads is non-overlapping the first groove pattern in the second direction.

2. The display apparatus of claim 1, wherein the first groove pattern is disposed between the plurality of first pads and the display area when viewed on a plane.

3. The display apparatus of claim 1, further comprising an intermediate insulation layer disposed between the plurality of signal lines and the display element layer and defined a first opening exposing the plurality of first pads.

4. The display apparatus of claim 3, wherein the insulation layer is further defined a second groove pattern disposed on the non-display area, extended in the first direction, and spaced apart from the first groove pattern with the plurality of first central pads therebetween when viewed on a plane.

5. The display apparatus of claim 4, wherein a distance in the first direction between the first groove pattern and a side wall of the intermediate insulation layer defining the first opening is greater than a distance in the first direction between the second groove pattern and the side wall.

6. The display apparatus of claim 4, wherein a length of the second groove pattern in the first direction is greater than a length of the first groove pattern in the first direction.

7. The display apparatus of claim 4, further comprising a test circuit spaced apart from the plurality of first pads with the second groove pattern therebetween when viewed on the plane, and electrically connected to at least some of the plurality of first central pads.

8. The display apparatus of claim 7, wherein the test circuit is disposed between the substrate and the insulation layer.

9. The display apparatus of claim 7, wherein the intermediate insulation layer comprises a first intermediate insulation layer covering the test circuit and a second intermediate insulation layer spaced apart from the first intermediate insulation layer.

10. The display apparatus of claim 7, further comprising a plurality of second pads disposed in the non-display area, and spaced apart from the plurality of the first pads with the test circuit therebetween when viewed on the plane, and
wherein the plurality of second pads comprises a plurality of second central pads and a plurality of second outer pads spaced apart from the plurality of the second central pads in the first direction.

11. The display apparatus of claim 10, wherein the insulation layer is further defined a third groove pattern disposed between the test circuit and the plurality of second pads when viewed on the plane, and extended in the first direction.

12. The display apparatus of claim 11, wherein a distance in the first direction between the second groove pattern and a side wall of the intermediate insulation layer defining the first opening is the same as a distance in the first direction between the third groove pattern and the side wall.

13. The display apparatus of claim 7, wherein the insulation layer is further defined a fourth groove pattern overlapping the test circuit and extended in the first direction.

14. A display apparatus comprising:
a substrate comprising a display area and a non-display area adjacent to the display area;
a plurality of signal lines disposed on the substrate;
a display element layer disposed on the plurality of signal lines and disposed on the display area;
a plurality of first pads disposed on the display element layer and disposed on the non-display area;
an intermediate insulation layer disposed between the plurality of signal lines and the display element layer and defined a first opening exposing the plurality of first pads; and
an insulation layer disposed on the display element layer and defined a first groove pattern extended in a first direction and disposed on the non-display area;

wherein the plurality of first pads comprises a plurality of first central pads and a plurality of first outer pads spaced apart from the plurality of first central pads in the first direction,
wherein the first groove pattern is defined only between an area where the first central pads are disposed and the display area, and
wherein an area between an area where the first outer pads are disposed and the display area is completely covered by the insulation layer.

15. The display apparatus of claim 14, the first groove pattern is not disposed between the plurality of first outer pads and the display area.

16. The display apparatus of claim 14, wherein the first groove pattern is disposed between the plurality of first pads and the display area when viewed on a plane, and
wherein the insulation layer is further defined a second groove pattern spaced apart from the first groove pattern with the plurality of first pads therebetween and extended in the first direction.

17. The display apparatus of claim 16, wherein a distance in the first direction between the first groove pattern and a side wall of the intermediate insulation layer defining the first opening is greater than a distance in the first direction between the second groove pattern and the side wall.

18. The display apparatus of claim 16, wherein a length of the second groove pattern in the first direction is greater than a length of the first groove pattern in the first direction.

19. The display apparatus of claim 16, wherein the insulation layer is further defined a third groove pattern spaced apart from the second groove pattern in a second direction intersecting the first direction when viewed on the plane, and extended in the first direction, and
wherein the display apparatus further comprises a test circuit disposed between the second groove pattern and the third groove pattern when viewed on the plane, and electrically connected to at least some of the plurality of first central pads.

20. The display apparatus of claim 19, wherein a length of the second groove pattern in the first direction is same as a length of the third groove pattern in the first direction.

* * * * *